(12) United States Patent
Fukuda

(10) Patent No.: US 8,410,861 B2
(45) Date of Patent: Apr. 2, 2013

(54) PIEZOELECTRIC VIBRATOR, OSCILLATOR, ELECTRONIC EQUIPMENT AND RADIO-CONTROLLED TIMEPIECE, AND METHOD OF MANUFACTURING PIEZOELECTRIC VIBRATOR

(75) Inventor: Junya Fukuda, Chiba (JP)

(73) Assignee: Seiko Instruments Inc., Chiba (JP)

( * ) Notice: Subject to any disclaimer, the term of this patent is extended or adjusted under 35 U.S.C. 154(b) by 237 days.

(21) Appl. No.: 13/035,443

(22) Filed: Feb. 25, 2011

(65) Prior Publication Data

US 2011/0140794 A1 Jun. 16, 2011

Related U.S. Application Data

(63) Continuation of application No. PCT/JP2008/065249, filed on Aug. 27, 2008.

(51) Int. Cl.
H03B 5/32 (2006.01)
H01L 41/053 (2006.01)

(52) U.S. Cl. .................. 331/156; 333/200; 310/370

(58) Field of Classification Search .............. 331/156; 333/200; 310/370
See application file for complete search history.

(56) References Cited

U.S. PATENT DOCUMENTS

| | | | |
|---|---|---|---|
| 7,439,658 B2 * | 10/2008 | Aratake | 310/344 |
| 8,179,021 B2 * | 5/2012 | Fukuda | 310/344 |
| 8,212,454 B2 * | 7/2012 | Onitsuka et al. | 310/348 |
| 2002/0121175 A1 | 9/2002 | Kitamura et al. | |
| 2010/0237739 A1 * | 9/2010 | Ouchi et al. | 310/312 |
| 2011/0018398 A1 * | 1/2011 | Fukuda | 310/344 |
| 2011/0050045 A1 * | 3/2011 | Aratake et al. | 310/344 |
| 2011/0140795 A1 * | 6/2011 | Yamaguchi et al. | 331/158 |
| 2011/0140796 A1 * | 6/2011 | Fukuda | 331/158 |
| 2011/0148249 A1 * | 6/2011 | Yamaguchi et al. | 310/312 |
| 2011/0148539 A1 * | 6/2011 | Fukuda | 331/158 |
| 2011/0164473 A1 * | 7/2011 | Onitsuka et al. | 368/47 |
| 2011/0169584 A1 * | 7/2011 | Fukuda | 331/158 |

FOREIGN PATENT DOCUMENTS

| | | |
|---|---|---|
| JP | 2001-144582 A | 5/2001 |
| JP | 2002-261577 A | 9/2002 |
| JP | 2003-142976 A | 5/2003 |
| JP | 2007-028580 A | 2/2007 |
| JP | 2007-129327 A | 5/2007 |
| JP | 2007-184752 A | 7/2007 |
| JP | 2007-251238 A | 9/2007 |
| JP | 2007-251239 A | 9/2007 |
| JP | 2008-113238 A | 5/2008 |

OTHER PUBLICATIONS

International Search Report for International Application No. PCT/JP2008/065249, dated Nov. 18, 2008, 2 pages.

* cited by examiner

Primary Examiner — Joseph Chang
(74) Attorney, Agent, or Firm — Brinks Hofer Gilson & Lione

(57) ABSTRACT

A piezoelectric vibrator including a base substrate and a lid substrate which are bonded to each other with a cavity formed therebetween; a piezoelectric vibrating reed which has a pair of vibration arm portions extending in parallel, a pair of excitation electrodes that vibrate the pair of vibration arm portions, and a mount electrode that is electrically connected to the pair of excitation electrodes, the piezoelectric vibrating reed being mounted on the base substrate within the cavity via the mount electrode; an insulation film which is formed on the piezoelectric vibrating reed so as to cover the excitation electrodes; and a getter material formed of the metallic material that is formed on any of the base substrate or the lid substrate so as to be arranged within the cavity and improve a degree of vacuum within the cavity by being heated.

13 Claims, 20 Drawing Sheets

PIEZOELECTRIC VIBRATOR, OSCILLATOR, ELECTRONIC EQUIPMENT AND RADIO-CONTROLLED TIMEPIECE, AND METHOD OF MANUFACTURING PIEZOELECTRIC VIBRATOR

RELATED APPLICATIONS

This application is a continuation of PCT/JP2008/065249 filed on Aug. 27, 2008. The entire contents of these applications are incorporated herein by reference.

TECHNICAL FIELD

The present invention relates to a Surface Mount Device type (SMD) piezoelectric vibrator in which a piezoelectric vibrating reed is accommodated in a cavity formed between two joined substrates, an oscillator having the piezoelectric vibrator, electronic equipment and a radio-controlled timepiece, and a piezoelectric vibrator manufacturing method to manufacture the piezoelectric vibrator.

BACKGROUND ART

In recent years, piezoelectric vibrators using crystals or the like have been used in mobile phones or personal digital assistants, as time sources or timing sources such as control signals, or reference signal sources and the like. There are various examples of such piezoelectric vibrators, but the surface mount type piezoelectric vibrator is known as one such example. With this type of piezoelectric vibrator, a two layer structure type, in which a base substrate and a lid substrate are directly bonded to each other and a piezoelectric vibrating reed is accommodated in a cavity formed between the two substrates, is known. In addition, the piezoelectric vibrating reed has a pair of vibration arm portions extending in parallel, a pair of excitation electrodes that vibrate the pair of vibration arm portions, and a mount electrode that is electrically connected to the pair of excitation electrodes, and is mounted on the base substrate via the mount electrode.

However, it is generally desirable with piezoelectric vibrators that the equivalent resistance values (effective resistance value, Re) of the piezoelectric vibrator are preferably lowered. Since piezoelectric vibrators with low equivalent resistance values can vibrate a piezoelectric vibrating reed using less electric power, they are more energy efficient piezoelectric vibrators.

As one of the common methods of suppressing the equivalent resistance value, the option of making the inside of a cavity closer to a vacuum is known. Furthermore, as a method of making the inside of a cavity closer to a vacuum, the option of heating and activating getter material (a process known as gettering), which is a metallic film inside a cavity, by irradiating a laser or the like from the outside, is known (see Patent Citation 1).

According to this method, since the getter material in the activation state absorbs the gas mainly consisting of oxygen in the cavity by chemical reaction, the inside of the cavity can be made closer to a vacuum. In addition, the getter material is arranged on a surface of the piezoelectric vibrating reed or an inner wall of a substrate that forms the cavity.

Patent Citation 1: JP-A-2003-142976

However, in the piezoelectric vibrator of the related art, during gettering, the below problems remained depending on the position where the getter material was arranged.

That is, firstly, in a case where the getter material is arranged on the surface of the piezoelectric vibrating reed, since the piezoelectric vibrating reed is also heated upon heating the getter material by a laser, the piezoelectric vibrating reed is subjected to the stresses of heating.

Furthermore, in a case where the getter material is arranged on the inner wall of a substrate, there was a high chance that a part of the getter material, which was evaporated and scattered when the getter material was heated by a laser, would become attached to an outer surface of the piezoelectric vibrating reed. That is, there was a chance that the getter material could deposit on the outer surface of the piezoelectric vibrating reed. Particularly, the nearer the irradiation position of the laser, the more easily the evaporated getter material was attached. Moreover, when the getter material became attached, there was a risk that a portion between a pair of excitation electrodes formed on the outer surface of the piezoelectric vibrating reed would conduct and short-circuit.

The invention was made in view of the above circumstances, and an object thereof is to provide a piezoelectric vibrating reed that can perform the gettering while suppressing the short-circuiting of a portion between a pair of excitation electrodes without subjecting the piezoelectric vibrating reed to load due to the heating. Furthermore, another object thereof is to provide a piezoelectric vibrator manufacturing method of manufacturing a piezoelectric vibrator, an oscillator having the piezoelectric vibrator, and electronic equipment and a radio-controlled timepiece.

SUMMARY OF THE INVENTION

The invention provides the following means to solve the above-mentioned object:

(1) According to the invention, there is provided a method of manufacturing a piezoelectric vibrator with a piezoelectric vibrating reed accommodated within a cavity formed between a base substrate and a lid substrate that are bonded to each other, therein which has a pair of vibration arm portions extending in parallel, a pair of excitation electrodes that vibrates the pair of vibration arm portions, and a mount electrode that is electrically connected to the pair of excitation electrodes; and, after producing the piezoelectric vibrating reed, to provide a bonding process of bonding the base substrate and the lid substrate to each other so as to accommodate the piezoelectric vibrating reed, and the getter material within the cavity after mounting the piezoelectric vibrating reed on the base substrate via the mount electrode and a getter material forming process of forming getter material formed of a metallic material, which improves the degree of vacuum in the cavity by being heated, in any one substrate of the base substrate or the lid substrate so as to be arranged within the cavity, including an insulation film forming process of forming an insulation film so as to cover the aforementioned excitation electrodes.

According to the above method of manufacturing the piezoelectric vibrator, firstly, after producing the piezoelectric vibrating reed, the insulation film forming process of forming the insulation film so as to cover the excitation electrodes is performed. As a result, the excitation electrodes can be protected by the insulation film, whereby the exposure of the excitation electrodes can be prevented and direct contact of the excitation electrodes with the outside can be mitigated.

Furthermore, at the same timing or before or after the insulation film forming process, the getter material forming process of forming the getter material in either one of the base substrate or the lid substrate is performed. At this time, the getter material is formed so as to be arranged within the cavity that is formed later.

In addition, after the two above-mentioned processes are finished, a bonding process is performed. In doing so, firstly, the piezoelectric vibrating reed is mounted on the base substrate. At this time, the piezoelectric vibrating reed is mechanically bonded and supported on the base substrate, and the excitation electrodes are mounted so as to be able to be electrically connected to the outside of the cavity via the mount electrode. Moreover, after mounting the piezoelectric vibrating reed, the base substrate and the lid substrate are bonded to each other so as to accommodate the excitation electrodes and the getter material within the cavity. As a result, it is possible to realize the piezoelectric vibrator in which the piezoelectric vibrating reed is accommodated within the cavity that is formed between the lid substrate and the base substrate.

Particularly, the getter material is formed on either one substrate of the base substrate or the lid substrate and not the piezoelectric vibrating reed. Accordingly, during gettering, even as the getter material is heated by a laser or the like, the piezoelectric vibrating reed is not affected by the heating. Thus, the piezoelectric vibrating reed is not subjected to the stresses of heating. For this reason, since the quality or the property of the piezoelectric vibrator is not affected, high quality of the piezoelectric vibrator can be promoted.

In addition, since the excitation electrodes are protected by the insulation film, during gettering, even if the getter material is scattered in the direction of the excitation electrodes due to evaporation, the getter material can be attached to the insulation film. That is, it is possible to suppress the gettering material from being attached to the excitation electrodes not as in the related art. For that reason, it is possible to perform the gettering while suppressing the short-circuiting of the portion between the pair of excitation electrodes.

(2) Additionally, during the forming process of the getter material, two getter materials may be formed so as to be oppositely arranged at both sides with the piezoelectric vibrating reed pinched therebetween when the piezoelectric vibrating reed is mounted, while each of the getter materials may be formed so as to be extended parallel to the vibration arm portions at a position adjacent to the insulation film.

In this case, the getter materials are formed in the position adjacent to the insulation film. For that reason, during gettering, the getter material scattered due to evaporation can actively be attached to the insulation film, whereby it is possible to suppress the getter material from being attached to other areas (for example, the mount electrode) of the piezoelectric vibrating reed that are not covered by the insulation film. That is, it is possible to limit the area to which the getter material in the insulation film that protects the excitation electrodes can be attached. If the getter material is attached to a portion other than the insulation film, there is a chance that the piezoelectric vibrating reed could be affected. However, since the attachment of the getter material can be limited to the insulation film, this risk does not exist. Thus, further high quality can be promoted.

(3) Furthermore, during the insulation film forming process, the insulation film may be formed on an upper surface side and a lower surface side of the piezoelectric vibrating reed facing the lid substrate and the base substrate, respectively.

Herein, in the piezoelectric vibrator which is manufactured by the piezoelectric vibrator manufacturing method according to the invention, since the getter material is formed in either one of the base substrate or the lid substrate, during gettering, the getter material scattered due to evaporation is further actively attached to the upper surface side and the lower surface side of the piezoelectric vibrating reed facing the substrates.

In this case, since the upper surface side and the lower surface side of the piezoelectric vibrating reed are covered by the insulation film, during gettering, the getter material scattered by the evaporation can reliably be attached to the insulation film. As a result, it is possible to further suppress the getter material from being attached to the excitation electrodes, and the gettering can be performed while reliably preventing the short-circuiting of the portion between the pair of the excitation electrodes.

Furthermore, since the insulation film is formed at both of the upper surface side and the lower surface side of the piezoelectric vibrating reed, the difference in film stress generated by the insulation film between the upper surface and the lower surface can be kept low. For this reason, particularly when the insulation film is formed on the vibration arm portion, it is possible to stabilize the frequency of the piezoelectric vibrating reed during vibration.

(4) Moreover, during the insulation film forming process, the insulation film may be formed over a side surface of the piezoelectric vibrating reed.

In this case, the insulation film is formed at both of the upper surface side and the lower surface side of the piezoelectric vibrating reed, and covers the side surface side. That is, the insulation film covers the entire periphery of the piezoelectric vibrating reed. As a result, it is possible to further suppress the evaporated getter material from being attached to the excitation electrodes.

(5) Furthermore, when producing the piezoelectric vibrating reed, the mount electrode and the excitation electrodes are formed integrally with an under layer of chromium and a finishing layer of gold, and during the insulation film forming process, after removing the finishing layer in the excitation electrodes, the insulation film may be formed on the under layer using silicon dioxide.

In this case, since the mount electrode and the excitation electrodes are integrally formed, conductivity between both electrodes can be ensured.

Moreover, in the mount electrode, since chromium having a high hardness is used as the under layer, the mount electrode can be strengthened. In addition, since gold is used as the finishing layer, it is possible to secure the conductivity and the mountability of the mount electrode during mounting. Hence, high quality of the piezoelectric vibrator can be promoted.

Furthermore, the finishing layer is removed in the excitation electrodes and the insulation film is formed on the under layer by silicon dioxide having a high cohesion with chromium, the excitation electrodes and the insulation film can be attached strongly with each other. For that reason, it is possible to suppress peeling of the insulation film.

(6) Furthermore, a piezoelectric vibrator according to the invention is comprised of: a base substrate and a lid substrate which are bonded to each other with a cavity formed therebetween; a pair of vibration arm portions extending in parallel; a pair of excitation electrodes that vibrate the pair of vibration arm portions; and a mount electrode that is electrically connected to the pair of excitation electrodes; formed with the piezoelectric vibrating reed being mounted on the base substrate within the cavity via the mount electrode with an insulation film which is formed on the piezoelectric vibrating reed so as to cover the excitation electrodes; and provided with getter material formed of metallic material that is formed on the base substrate or the lead substrate so as to be arranged within the cavity and improve the degree of vacuum within the cavity by being heated.

In this case, it is possible to obtain the same working effect as the method of manufacturing the piezoelectric vibrator described in the above item (1).

(7) Furthermore, two getter materials may be formed so as to be oppositely arranged at both sides with the mounted piezoelectric vibrating reed pinched therebetween, and each of the getter materials may be formed so as to be extended parallel to the vibration arm portion in the position adjacent to the insulation film.

In this case, it is possible to obtain the same working effect as the method of manufacturing the piezoelectric vibrator described in the above item (2).

(8) The insulation film may be formed at the upper surface side and the lower surface side of the piezoelectric vibrating reed facing the lid substrate and the base substrate, respectively.

In this case, it is possible to obtain the same working effect as the method of manufacturing the piezoelectric vibrator described in the above item (3).

(9) Moreover, the insulation film may be formed across the side surface side of the piezoelectric vibrating reed.

In this case, it is possible to obtain the same working effect as the method of manufacturing the piezoelectric vibrator described in the above item (4).

(10) Furthermore, the excitation electrodes may be formed of chromium and the insulation film may be formed of silicon dioxide.

In this case, it is possible to obtain the same working effect as the method of manufacturing the piezoelectric vibrator described in the above item (5).

(11) Furthermore, the oscillator according to the invention is configured so that the piezoelectric vibrator described in any one of the above items (6) to (10) is electrically connected to an integrated circuit as an oscillating element.

(12) Furthermore, the electronic equipment according to the invention is configured so that the piezoelectric vibrator described in any one of the above items (6) to (10) is electrically connected to a measurement portion.

(13) Furthermore, the radio-controlled timepiece according to the invention is configured so that the piezoelectric vibrator described in any one of the above items (6) to (10) is electrically connected to a filter portion.

With the oscillator, the electronic equipment and the radio-controlled timepiece, since the piezoelectric vibrating reed is not subjected to the stresses of heating and the piezoelectric vibrator of a high quality, in which the short-circuiting is suppressed between the pair of the excitation electrodes of the piezoelectric vibrating reed, is included, similarly, high quality can be promoted.

With regard to the piezoelectric vibrator according to the invention, the gettering can be performed while suppressing the short-circuiting of the portion between the pair of excitation electrodes without subjecting the piezoelectric vibrating reed to the stresses of heating. Thus, high quality can be promoted.

Furthermore, with the method of manufacturing the piezoelectric vibrator according to the invention, the above-mentioned piezoelectric vibrator can be reliably produced.

Furthermore, with regard to the oscillator, the electronic equipment and the radio-controlled timepiece according to the invention, since the above-mentioned piezoelectric vibrator is provided, similarly, high quality can be promoted.

DETAILED DESCRIPTION OF THE PREFERRED EMBODIMENTS

Figure 1:
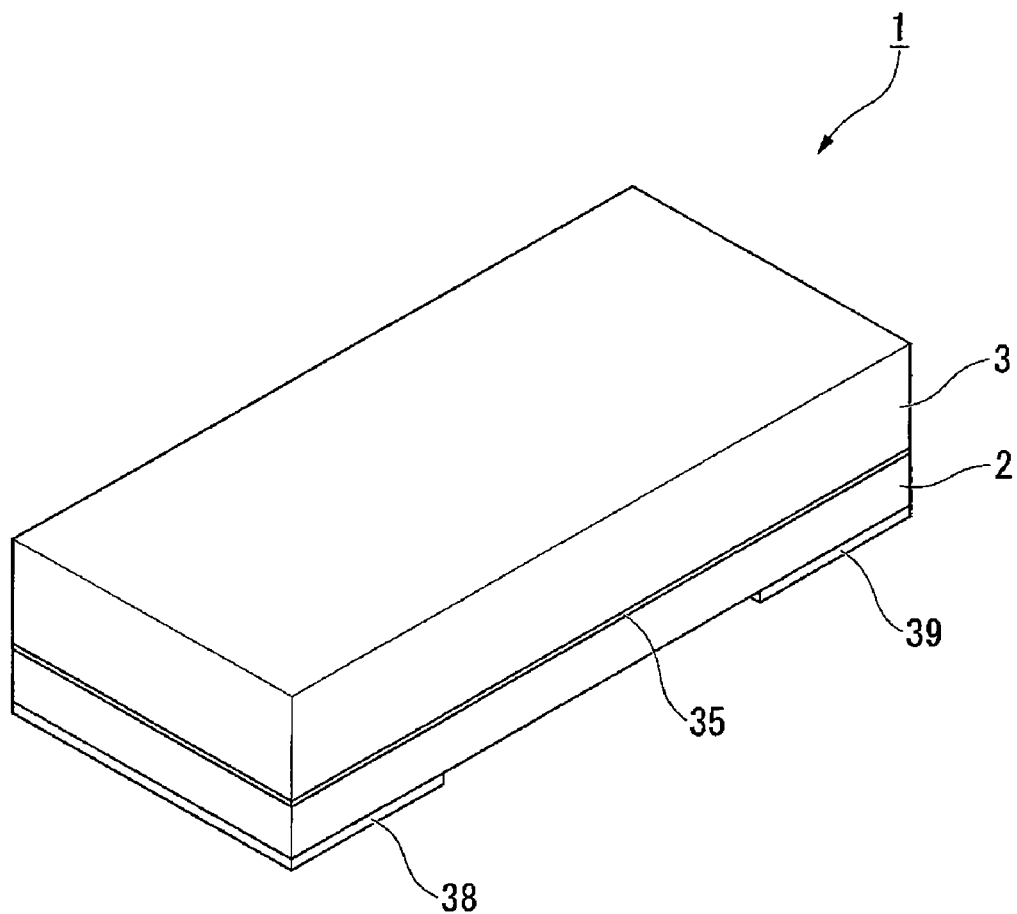
FIG. 1 is an exterior perspective view that shows an embodiment of a piezoelectric vibrator of the invention.

Hereinafter, an embodiment of a piezoelectric vibrator according to the invention will be explained with reference to FIGS. 1 to 22.

As shown in FIGS. 1 to 4, the piezoelectric vibrator 1 of the present embodiment is formed in the shape of a box, in which a base substrate 2 and a lid substrate 3 are stacked as two layers, and is a surface mount type piezoelectric vibrator in which a piezoelectric vibrating reed 4 is accommodated within a cavity C of an inner portion thereof.

Furthermore, in FIG. 4, in order to make the drawings easier to see, a pair of excitation electrodes 15, mount electrodes 16 and 17, a weight metal film 21 and an insulation film 20 described later are omitted.

As shown in FIGS. 5 to 10, the piezoelectric vibrating reed 4 is a tuning fork type vibrating reed formed of piezoelectric materials such as crystal, lithium tantalite and lithium niobate, and is vibrated when a predetermined voltage is applied.

The piezoelectric vibrating reed 4 has a pair of vibration arm portions 10 and 11 extending in parallel, a base portion 12 that integrally affixes the proximal end sides of the pair of vibration arm portions 10 and 11, a pair of excitation electrodes 15 including a first excitation electrode 13 and a second excitation electrode 14 that vibrate the pair of vibration arm portions 10 and 11, and mount electrodes 16 and 17 that are electrically connected to the first excitation electrode 13 and the second excitation electrode 14. In addition, the piezoelectric vibrating reed 4 shown in FIGS. 5 and 6 are shown in a state in which an insulation film 20 described later is omitted in order to explain the pair of excitation electrodes 15.

Moreover, the piezoelectric vibrating reed 4 of the embodiment includes groove portions 18 which are formed on the respective upper and lower surfaces of the pair of vibration arm portions 10 and 11 along a longitudinal direction of the vibration arm portions 10 and 11, respectively. The groove portions 18 are formed from the proximal end sides of the vibration arm portions 10 and 11 to approximately near the middle portion thereof.

Figure 5:
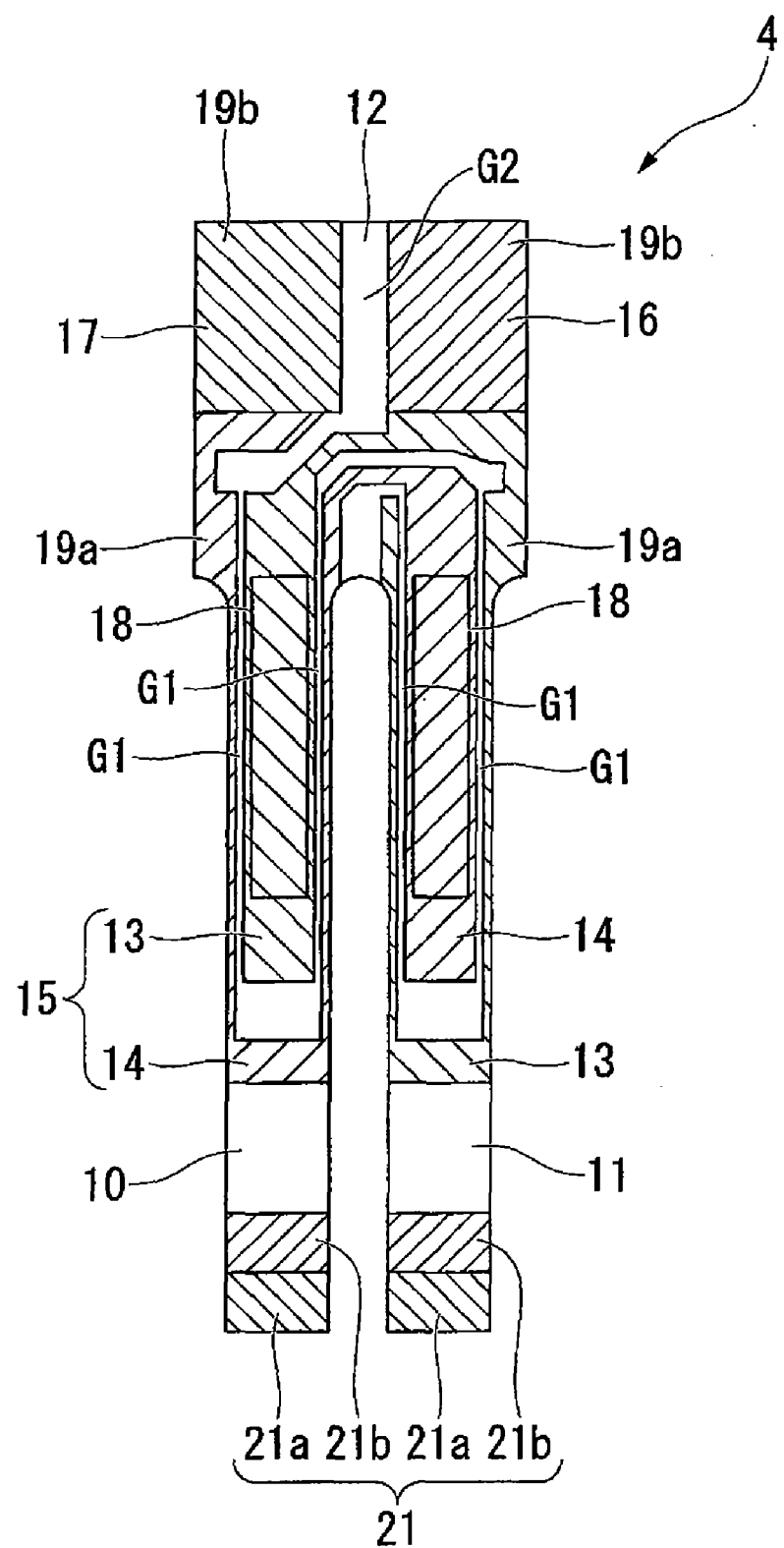
FIG. 5 is a top view diagram of the piezoelectric vibrating reed constituting the piezoelectric vibrator shown in FIG. 1 which shows a state in which an insulation film is removed.
Figure 6:
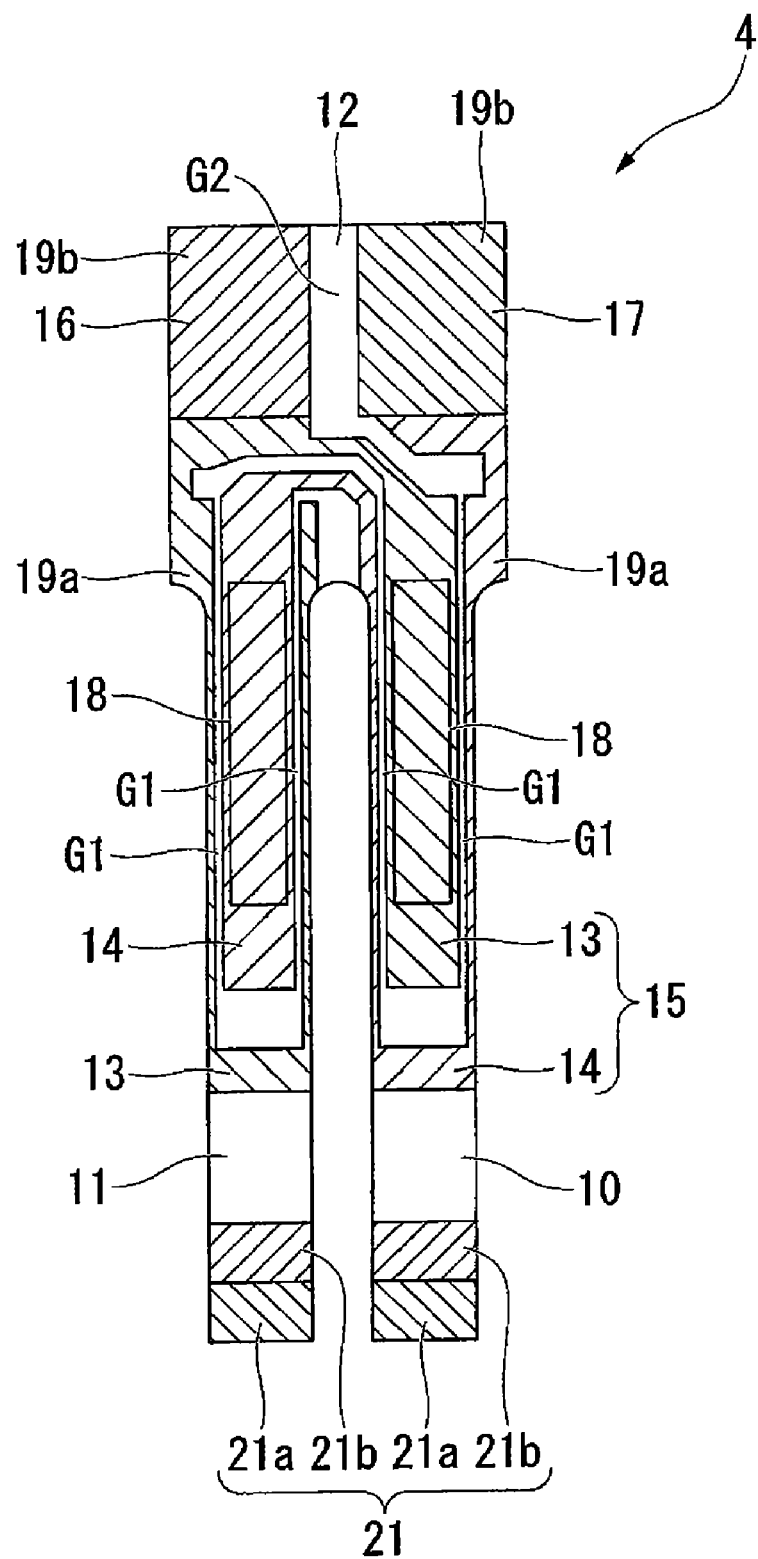
FIG. 6 is a bottom view of the piezoelectric vibrating reed shown in FIG. 5 which shows a state in which the insulation film is removed.
Figure 9:
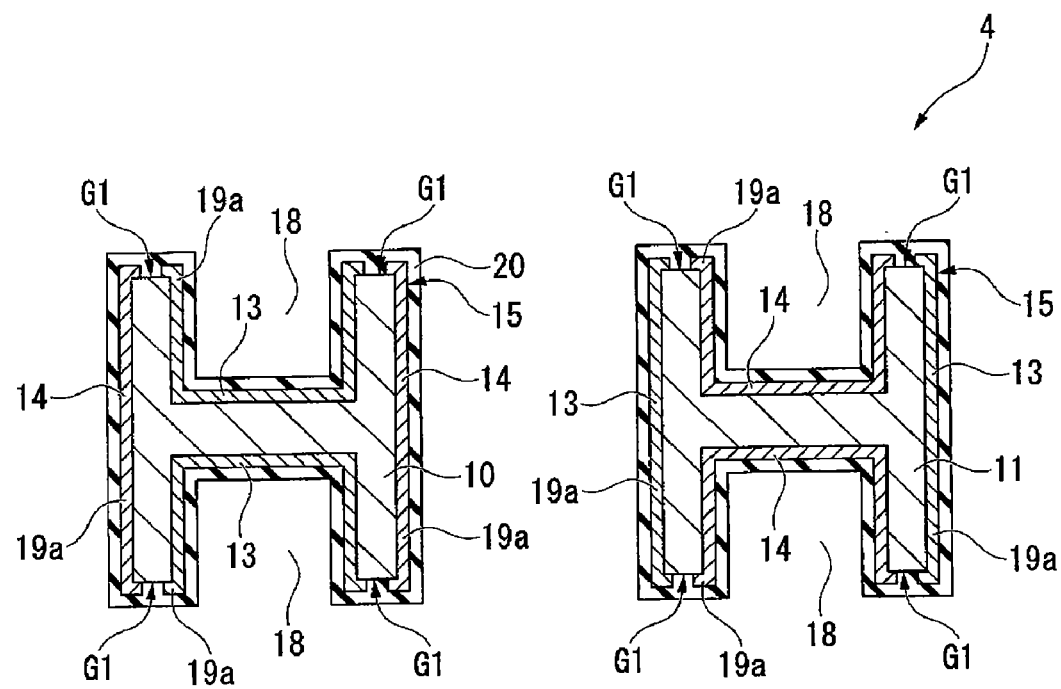
FIG. 9 is a cross-sectional view taken from arrow B-B shown in FIG. 7.
Figure 10:
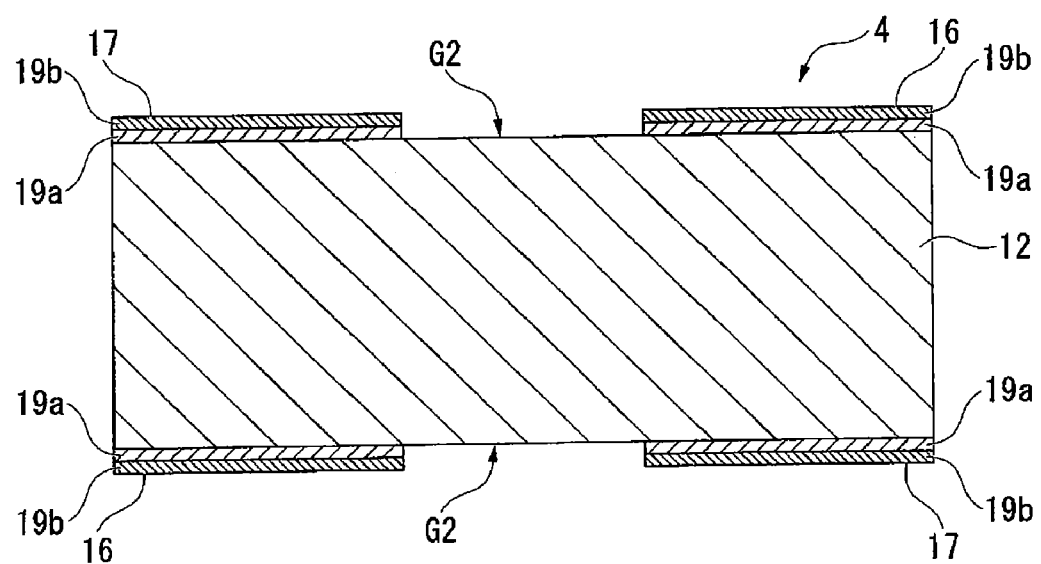
FIG. 10 is a cross-sectional view taken from arrow C-C shown in FIG. 7.

As shown in FIGS. 5 and 6, the pair of excitation electrodes 15 including the first excitation electrode 13 and the second excitation electrode 14 are electrodes that vibrate the pair of vibration arm portions 10 and 11 in an approaching or retracting direction by a predetermined resonant frequency, and are formed by being patterned on the outer surfaces of the pair of vibration arm portions 10 and 11 in a state of being electrically separated. Specifically, as shown in FIG. 9, the first excitation electrode 13 is mainly formed on the groove portions 18 of one vibration arm portion 10 and on both side surfaces of the other vibration arm portion 11, and the second excitation electrode 14 is mainly formed on both side surfaces of one vibration arm portion 10 and on the groove portions 18 of the other vibration arm portion 11.

Furthermore, as shown in FIGS. 5 and 6, between the first excitation electrode 13 and the second excitation electrode 14, gaps are provided on each of the upper surface and the lower surface of the piezoelectric vibrating reed 4, and both of the excitation electrodes 13 and 14 are electrically separated from each other by these gaps. In the shown example, among the gaps, particularly in a position adjacent to the groove portions 18 in each of the upper surface and the lower surface of the vibration arm portions 10 and 11, in a range wider than the groove portions 18 along the longitudinal direction of the vibration arm portions 10 and 11, is a gap G1 extending along the groove portions 18 having minute sizes of the width direction of the vibration arm portions 10 and 11. That is, the first excitation electrode 13 and the second excitation electrode 14 come close to each other pinching the gap G1 therebetween.

Moreover, the first excitation electrode 13 and the second excitation electrode 14 are electrically connected to the mount electrodes 16 and 17 on the upper surface and the lower surface of the base portion 12. Furthermore, between one mount electrode 16 and the other mount electrode 17, on the upper surface and the lower surface of the base portion 12, in approximately the center portion of the width direction of the base portion 12, a gap G2 along the longitudinal direction of the piezoelectric vibrating reed 4 is formed. While the gap G2 has a size of the width direction greater than that of the gap G1, one mount electrode 16 and the other mount electrode 17 are electrically separated from each other by the gap G2. Moreover, the voltage is applied to the piezoelectric vibrating reed 4 via the mount electrodes 16 and 17.

Furthermore, as shown in FIGS. 5, 6, 9 and 10, the pair of excitation electrodes 15 and mount electrodes 16 and 17 are integrally formed on the chromium under layer 19a. In addition, in the mount electrodes 16 and 17, a gold finishing layer 19b is stacked on the under layer 19a thereof.

Figure 7:
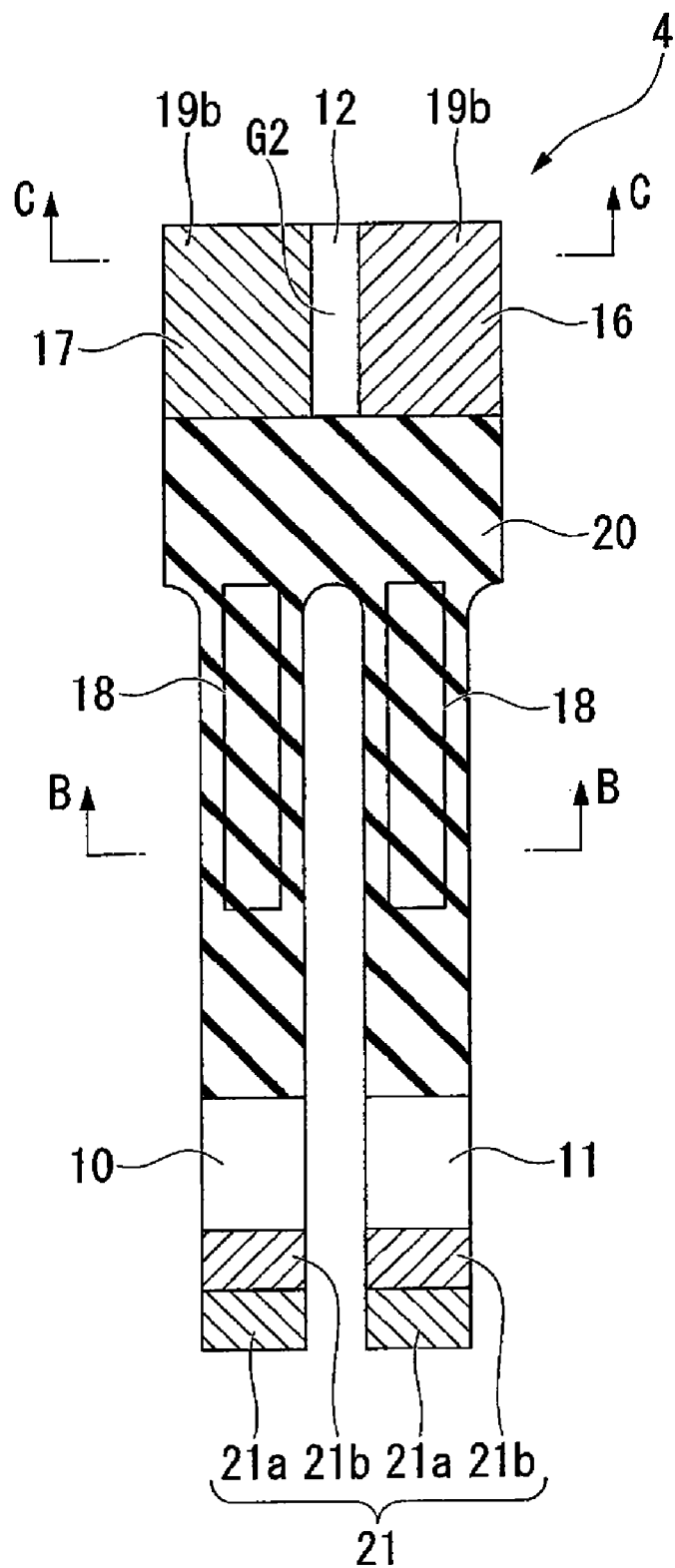
FIG. 7 is a top view of the piezoelectric vibrating reed constituting the piezoelectric vibrator shown in FIG. 1.
Figure 8:
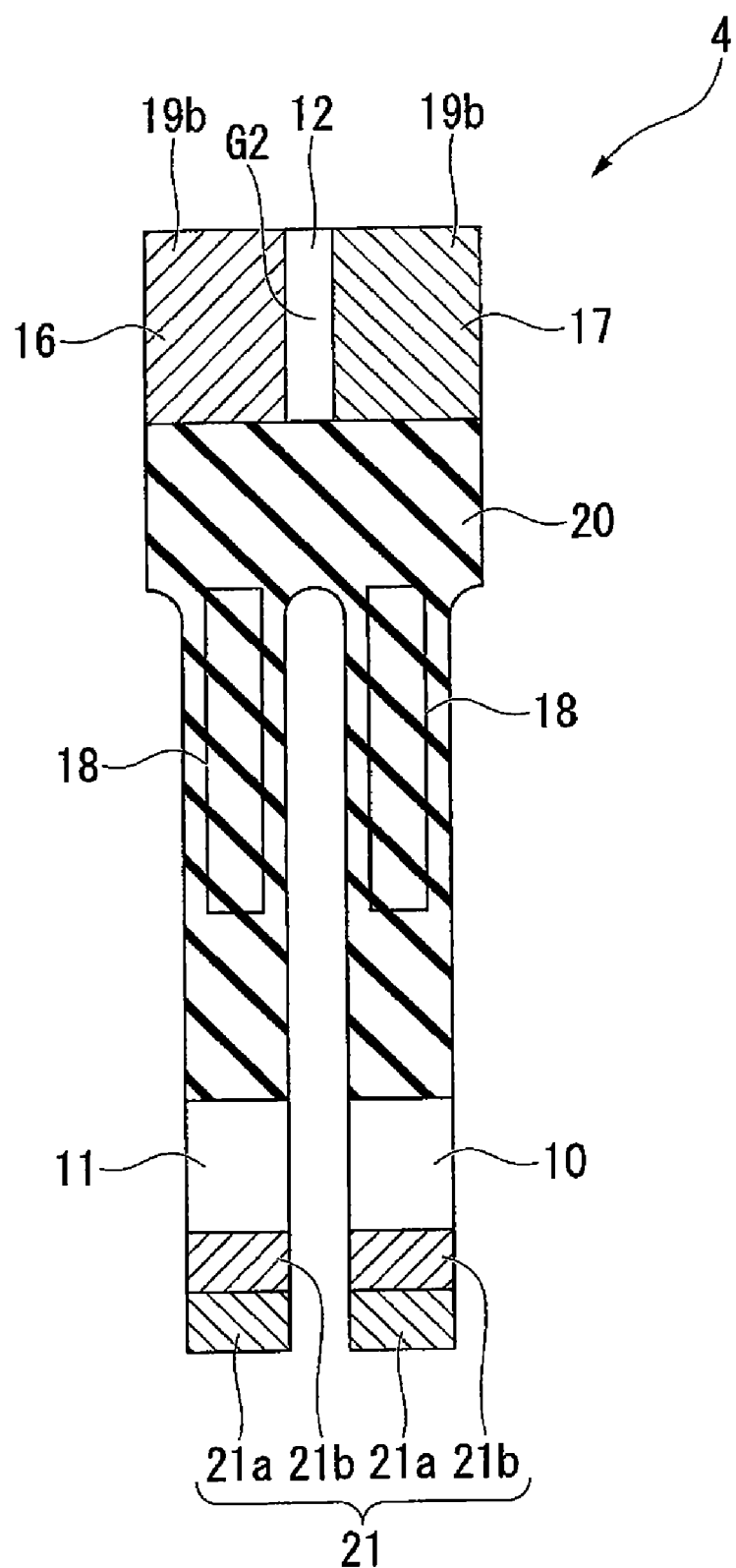
FIG. 8 is a bottom view of the piezoelectric vibrator shown in FIG. 7.

Furthermore, as shown in FIGS. 7 to 9, an insulation film 20 is formed on the piezoelectric vibrating reed 4 so as to cover the pair of excitation electrodes 15. In the present embodiment, the insulation film 20 is formed of silicon dioxide and is formed on the outer surface of the piezoelectric vibrating reed 4 that is situated from the proximal end of the pair of excitation electrodes 15 to the front end thereof in the longitudinal direction of the piezoelectric vibrating reed 4. Moreover, as shown in FIG. 9, the insulation films 20 are not only formed on the upper surface side and the lower surface side of the piezoelectric vibrating reed 4 respectively, but are also formed over both side surface sides of the piezoelectric vibrating reed 4. That is, the insulation films 20 are formed all over the periphery of the piezoelectric vibrating reed 4.

Furthermore, as shown in FIGS. 7 and 8, on the front ends of the pair of vibration arm portions 10 and 11, a weight metal film 21 for adjusting (frequency adjustment) so as to vibrate its own vibration state within a range of a predetermined frequency is coated. In addition, the weight metal film 21 is divided into a rough regulation film 21a used when roughly regulating the frequency and a minute regulation film 21b used when minutely regulating the frequency. By performing the frequency regulation using the rough regulation film 21a and the minute regulation film 21b, it is possible to limit the frequencies of the pair of vibration arm portions 10 and 11 within the range of the nominal frequency of the device.

Figure 3:
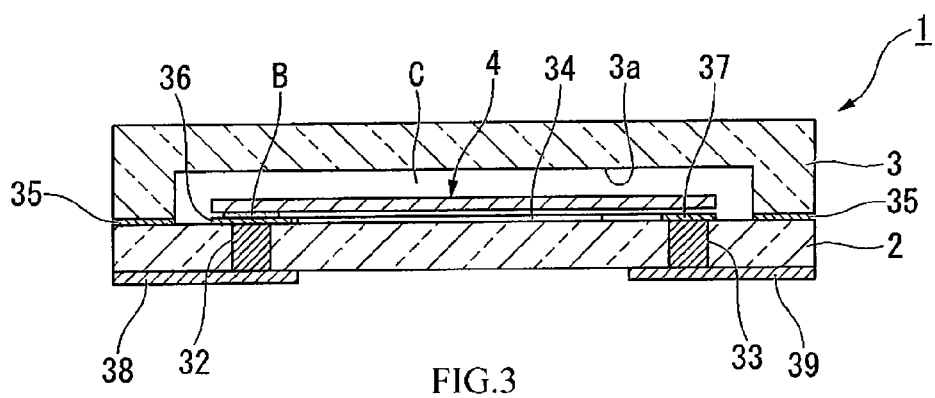
FIG. 3 is a cross-sectional view along line A-A of the piezoelectric vibrator shown in FIG. 2.
Figure 4:
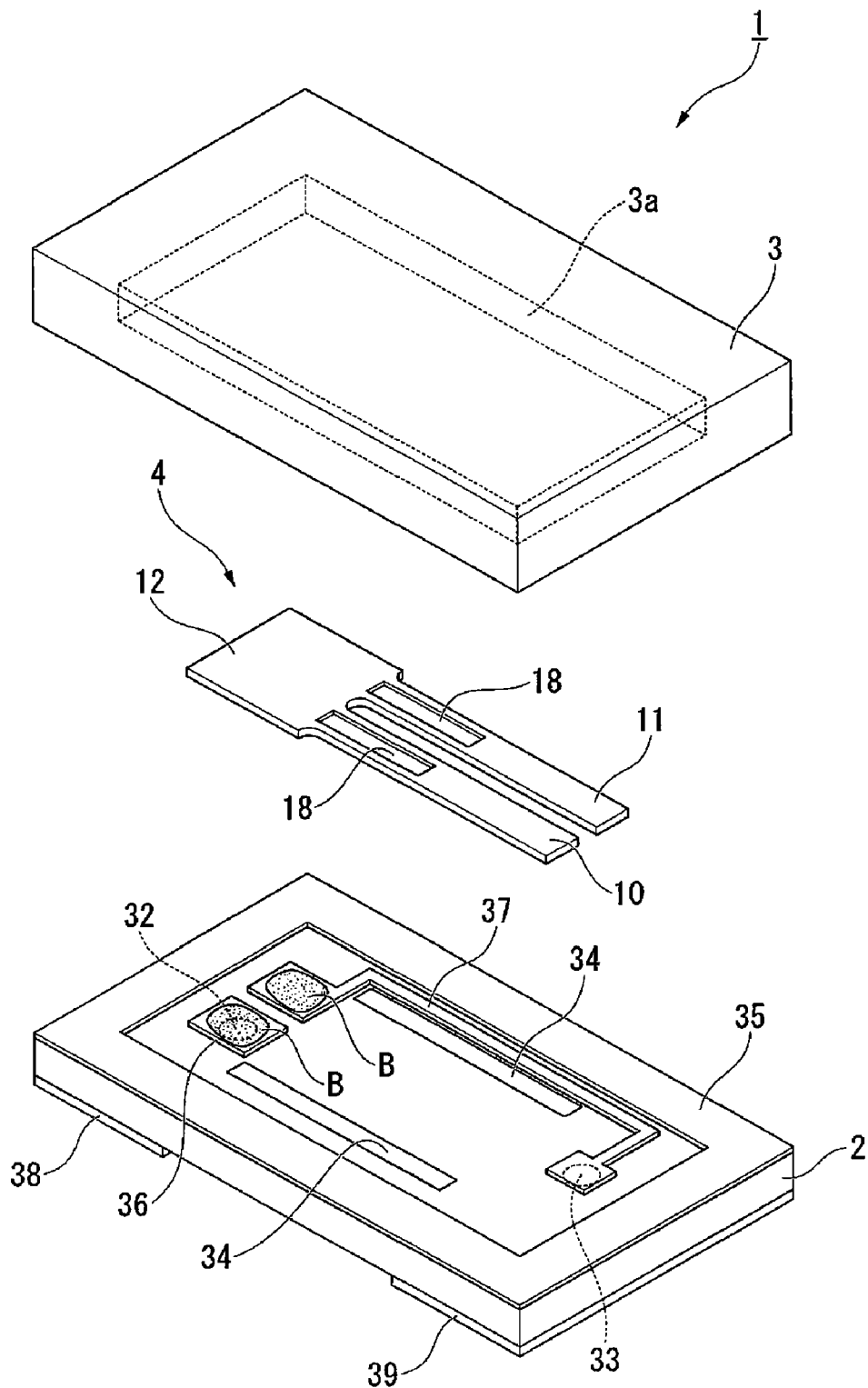
FIG. 4 is an exploded perspective view of the piezoelectric vibrator shown in FIG. 1.

As shown in FIGS. 3 and 4, the piezoelectric vibrating reed 4 configured as above is bump-bonded to the upper surface of the base substrate 2 using a bump B such as gold. To explain specifically, the pair of mount electrodes 16 and 17 is bump-bonded onto the bumps B, which are formed on lead-out electrodes 36 and 37 described later patterned on the upper surface of the base substrate 2, respectively, in the contact state. As a result, the upper surface side and the lower surface side of the piezoelectric vibrating reed 4 face the lid substrate 3 and the base substrate 2, respectively, and the piezoelectric vibrating reed 4 is mechanically bonded onto the base substrate 2 and is supported in a state floating from the upper surface of the base substrate 2, and the mount electrodes 16 and 17 and the lead-out electrodes 36 and 37 are electrically connected to each other, respectively.

The lid substrate 3 is a transparent insulation substrate formed of a glass material, for example, soda lime glass, and, as shown in FIGS. 1, 3 and 4, is formed in a board-shape. Furthermore, on the bonding surface side to which the base substrate 2 is bonded, a rectangular concave portion 3a into which the piezoelectric vibrating reed 4 enters is formed. The concave portion 3a is the concave portion for the cavity that becomes the cavity C which accommodates the piezoelectric vibrating reed 4 when both of the substrates 2 and 3 are overlapped. Moreover, the lid substrate 3 is anode-bonded to the base substrate 2 in a state in which the concave portion 3a is opposed to the base substrate 2 side.

The base substrate 2 is a transparent insulation substrate formed of the same glass material as that of the lid substrate 3, for example, soda lime glass, and, as shown in FIGS. 1 to 4, is formed in the shape of a plate at a size capable of being overlapped to the lid substrate 3.

On the base substrate 2, a pair of penetration electrodes 32 and 33 passing through the base substrate 2 in an up and down direction are formed so that each of one end thereof enters the cavity C.

The through electrodes 32 and 33 are formed between them and the base substrate 2 without any gaps, maintaining airtightness within the cavity C, and make outer electrodes 38 and 39 and lead-out electrodes 36 and 37 described later conduct to each other.

On the upper surface side (the bonding surface side to which the lid substrate 3 is bonded) of the base substrate 2, a getter material 34 which is formed so as to be arranged in the cavity C and improve the degree of vacuum in the cavity C by being heated, a bonding film 35 for anode bonding, and a pair of lead-out electrodes 36 and 37 are patterned. Among them, the bonding film 35 is formed of, for example, a conductive material such as aluminum, and is formed along the periphery of the base substrate 2 so as to surround the circumference of the concave portion 3a formed in the lid substrate 3.

Figure 2:
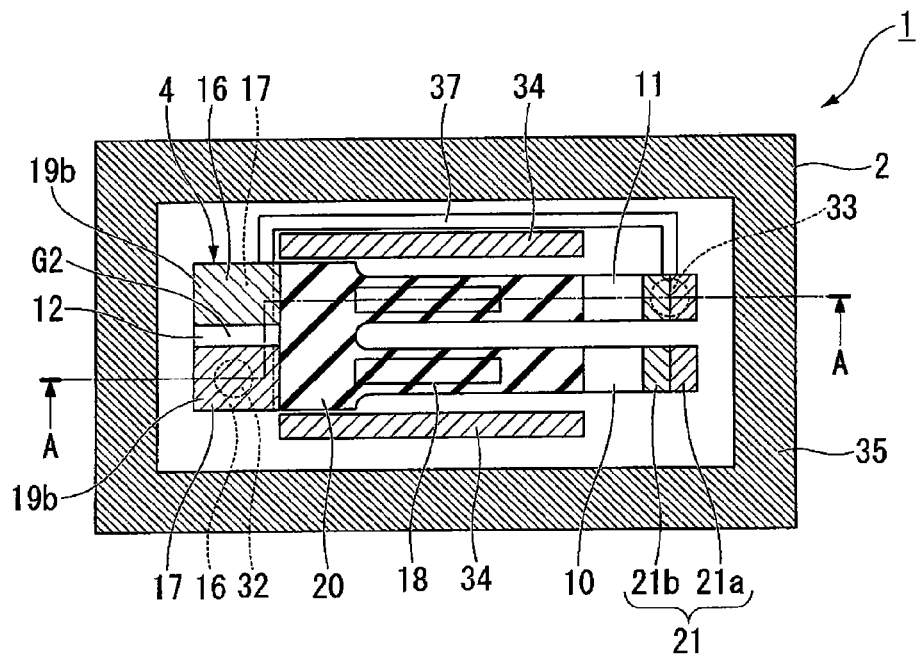
FIG. 2 is an inner configuration diagram of the piezoelectric vibrator shown in FIG. 1 which shows from above a piezoelectric vibrating reed with a lid substrate removed therefrom.

The getter material 34 is formed of, for example, aluminum, and, as shown in FIG. 2, two getter materials 34 are formed so as to be oppositely arranged at both sides with the mounted piezoelectric vibrating reed 4 interposed therebetween when seen from the plane. Herein, the expression "when seen from the plane" refers to a state in which the respective constituents of the piezoelectric vibrator 1 are projected from any one substrate side onto the other substrate of the base substrate 2 or the lid substrate 3.

Furthermore, each of the getter materials 34 are formed so as to extend in parallel to the vibration arm portions 10 and 11 in the position adjacent to the insulation film 20. That is, each of the getter materials 34 are formed as the same size as the insulation film 20 and are arranged in the same position of the insulation film 20 in the longitudinal direction of the piezoelectric vibrating reed 4.

Each of a pair of lead-out electrodes 36 and 37 is an electrode film of a two layer structure that has, for example, a lower layer of chromium and an upper layer of gold. Furthermore, as shown in FIGS. 2 to 4, the pair of lead-out electrodes 36 and 37 are patterned so that one lead-out electrode 36 electrically connects one through electrode 32 with one mount electrode 16 of the piezoelectric vibrating reed 4, and the other lead-out electrode 37 electrically connects the other through electrode 33 with the other mount electrode 17 of the piezoelectric vibrating reed 4.

Moreover, as shown in FIGS. 1, 3 and 4, on the lower surface of the base substrate 2, outer electrodes 38 and 39, which are electrically connected to the pair of through electrodes 32 and 33, respectively, are formed. That is, one outer electrode 38 is electrically connected to the first excitation electrode 13 of the piezoelectric vibrating reed 4 via one through electrode 32 and one lead-out electrode 36. Furthermore, the other outer electrode 39 is electrically connected to the second excitation electrode 14 of the piezoelectric vibrating reed 4 via the other through electrode 33 and the other lead-out electrode 37. As a result, the pair of excitation electrodes 15 can be electrically connected to the outside of the cavity C, respectively.

In the case of operating the piezoelectric vibrator 1 configured as above, a predetermined driving voltage is applied to the outer electrodes 38 and 39 formed on the base substrate 2. As a result, it is possible to make the electric current flow to the pair of excitation electrodes 15 including the first excitation electrode 13 and the second excitation electrode 14 of the piezoelectric vibrating reed 4, which makes it possible to vibrate the pair of vibration arm portions 10 and 11 in the approaching and separating direction by a predetermined frequency. Moreover, it is possible to use the vibration of the pair of vibration arm portions 10 and 11 as a time source, a timing source of the control signal, a reference signal source or the like.

Figure 11:
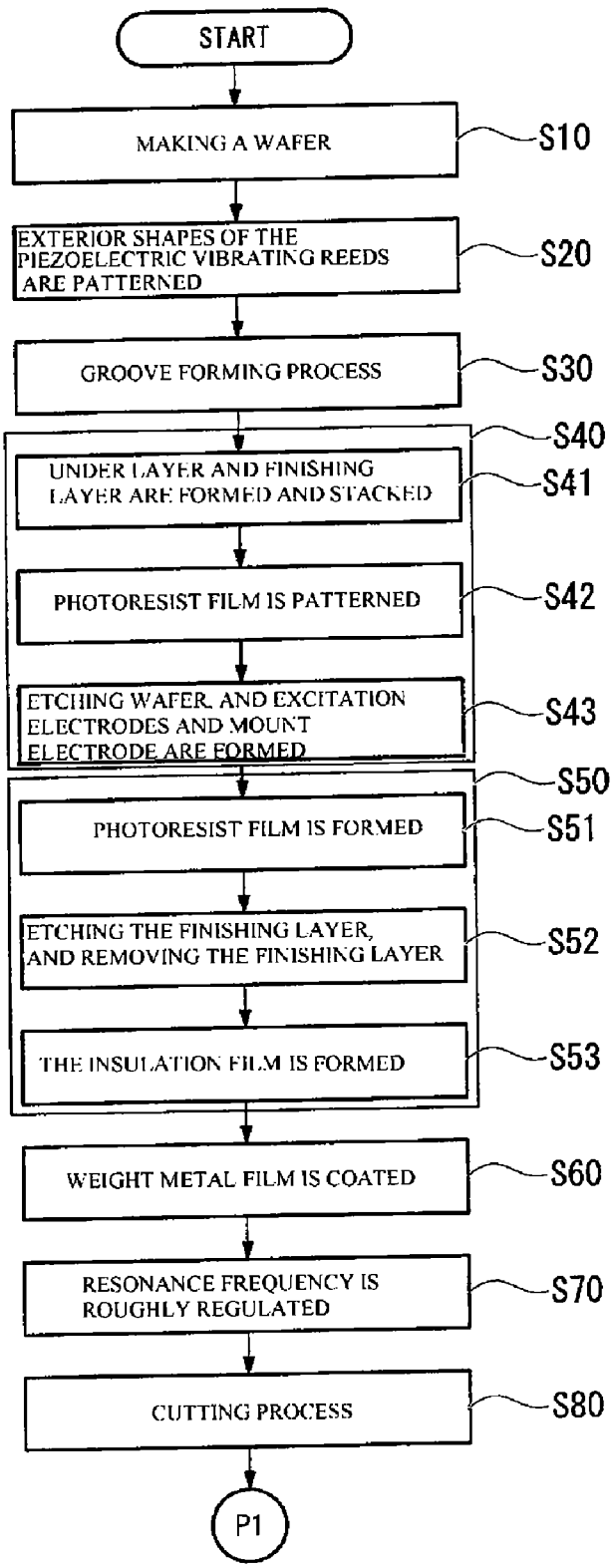
FIG. 11 is a flow chart that shows the flow of manufacturing the piezoelectric vibrator shown in FIG. 1.

Next, a method of manufacturing a plurality of above-mentioned piezoelectric vibrators 1 using a base substrate wafer (the base substrate) 40 and a lid substrate wafer (the lid substrate) 50 at a time will be explained with reference to the flow charts shown in FIGS. 11 and 12. In addition, in the present embodiment, a plurality of piezoelectric vibrators 1 is manufactured using the substrate of the wafer shape at a time, but without being limited thereto, one in which the size thereof is adapted to the exteriors of the base substrate 2 and the lid substrate 3 in advance, may be worked to manufacture only one at a time.

Firstly, as a piezoelectric vibrating reed production process, the piezoelectric vibrating reed 4 shown in FIGS. 5 to 10 is produced.

Specifically, firstly, a crystal Lambert gemstone is sliced at a predetermined angle to make a wafer of a fixed thickness. Next, after the wafer is wrapped and is subjected to rough working, a deformed layer is removed by the etching, and then a mirror surface polishing such as a polish is performed, thereby making a wafer S of a predetermined thickness (S10).

Figure 13:
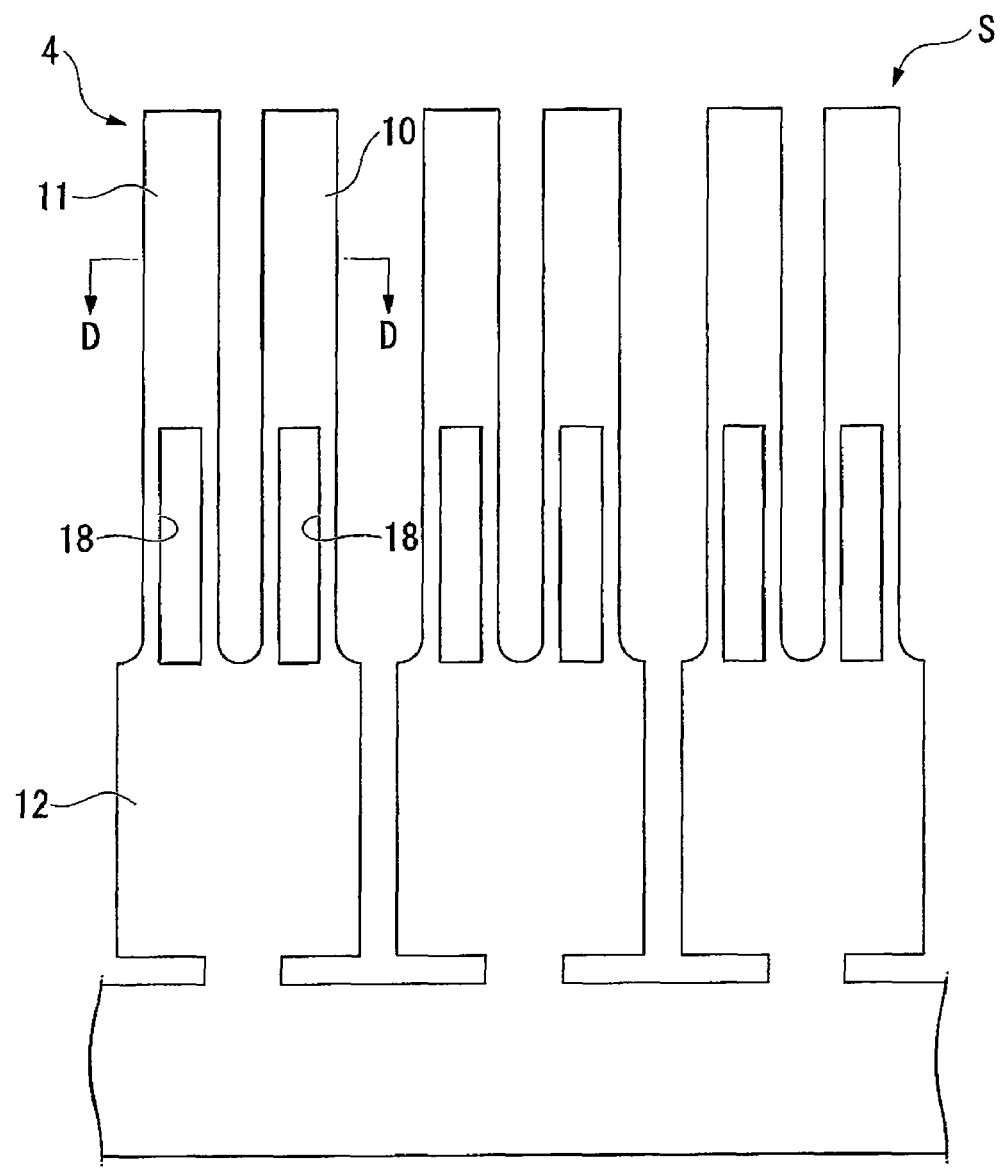
FIG. 13 is a diagram showing a process of manufacturing the piezoelectric vibrator according to the flow chart shown in FIG. 11 which shows a state in which an exterior shape of the piezoelectric vibrating reed and a groove portion are formed on a wafer.
Figure 14:
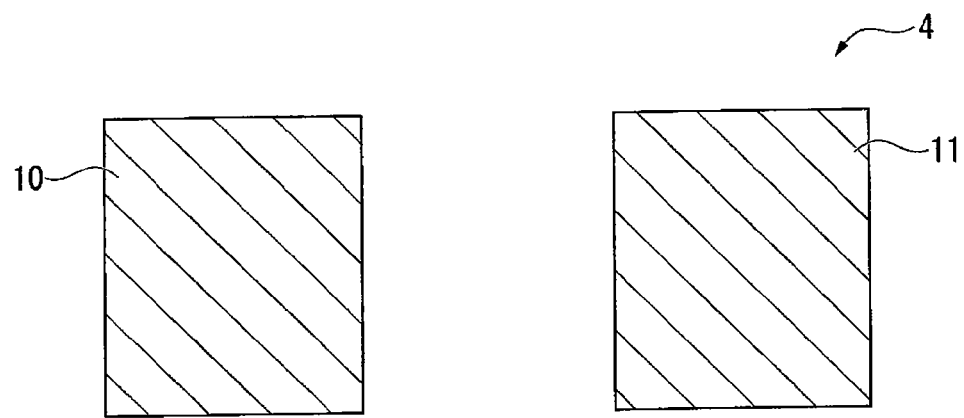
FIG. 14 is a cross-sectional view taken from arrow D-D shown in FIG. 13.

Next, as an exterior forming process, the wafer S after polishing is etched by a photolithograph technique or the like and the exterior shapes of the plurality of piezoelectric vibrating reeds 4 are patterned (S20). As a result, as shown in FIGS. 13 and 14, a plurality of exterior shapes of the piezoelectric vibrating reed 4 having the pair of vibration arm portions 10 and 11 and the substrate 12 is formed in the wafer S. Next, in the present embodiment, in the groove forming process, the respective pair of vibration arm portions 10 and 11 are etched by the photolithography technique or the like to form the groove portions 18 (S30).

Next, as an electrode forming process, the patterning of the chromium under layer 19a and the gold finishing layer 19b is performed and the pair of excitation electrodes 15 and mount electrodes 16 and 17 are integrally formed (S40).

Figure 15:
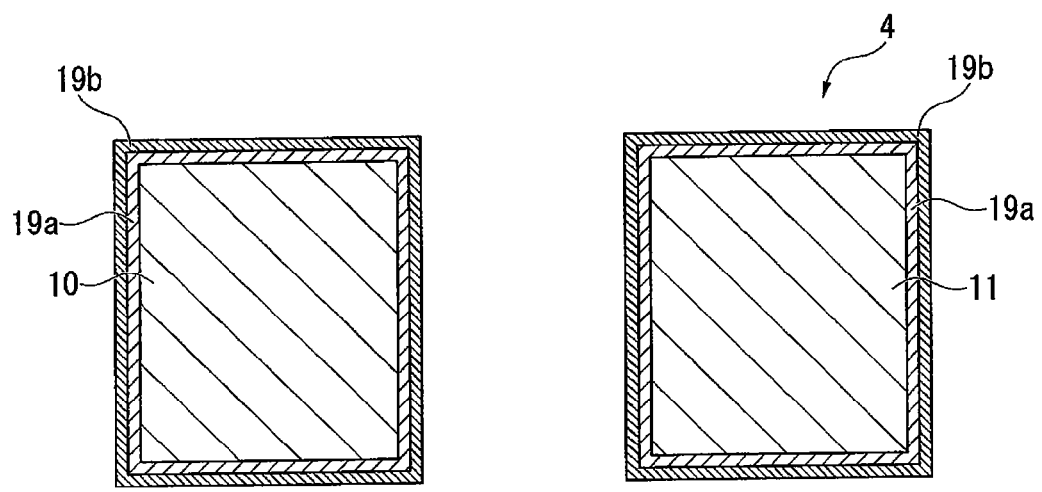
FIG. 15 is a diagram showing a process of manufacturing the piezoelectric vibrator according to the flow chart shown in FIG. 11 which shows a state in which an under layer and a finishing layer are formed after the state shown in FIG. 14.

The electrode forming process will be explained in detail. Firstly, as shown in FIG. 15, on the outer surface of the piezoelectric vibrating reed 4 including the position where the pair of excitation electrodes 15 and mount electrodes 16 and 17 are formed later, the under layer 19a and the finishing layer 19b are integrally formed and stacked, respectively (S41). At this time, the under layer 19a and the finishing layer 19b are formed, for example, by deposition, sputtering or the like.

Figure 16:
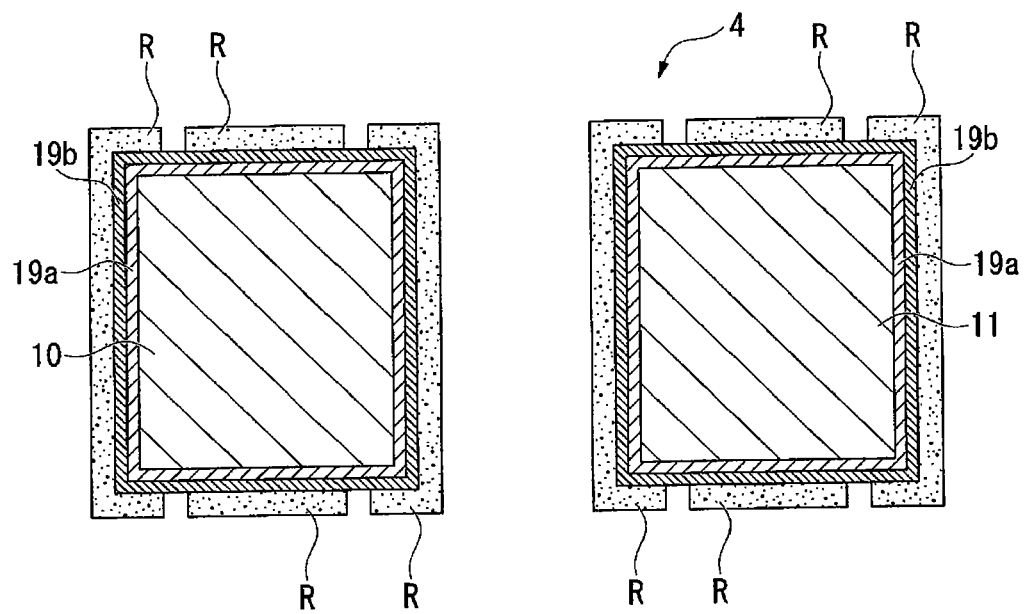
FIG. 16 is a diagram showing a process of manufacturing the piezoelectric vibrator according to the flow chart shown in FIG. 11 which shows a state in which a photo-resistant film is formed after the state shown in FIG. 15.

Next, as shown in FIG. 16, a photoresist film R becoming the mask during etching working is formed by the spray coating or the like, and then is patterned by the photolithography technique or the like (S42). At this time, in the under layer 19a and the finishing layer 19b, a portion, which forms the pair of excitation electrodes 15 and mount electrodes 16 and 17 later, is patterned so as to be coated by the photoresist film R.

Figure 17:
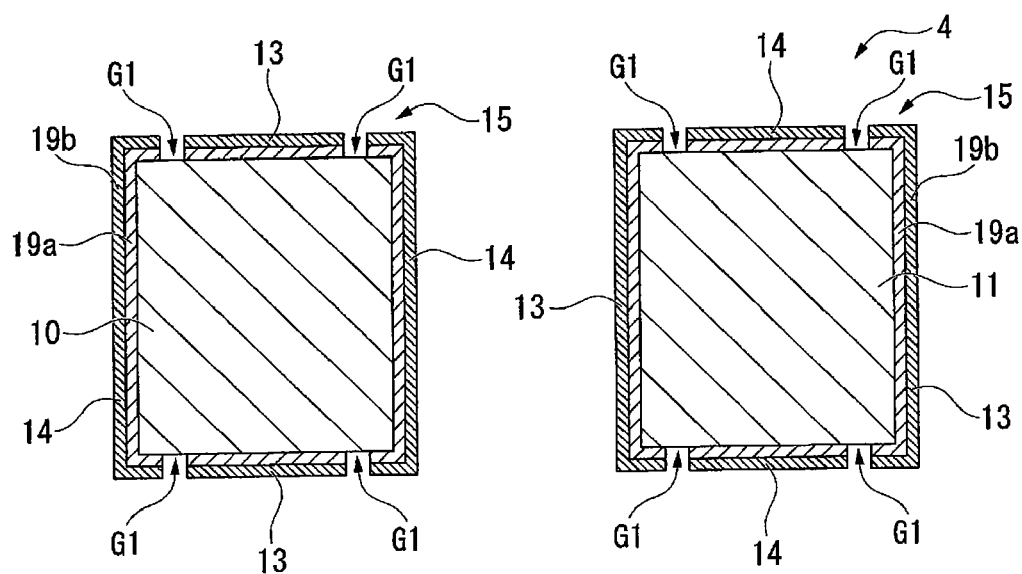
FIG. 17 is a diagram showing a process of manufacturing the piezoelectric vibrator according to the flow chart shown in FIG. 11 which shows a state in which etching has been performed on an under layer and a finishing layer after the state shown in FIG. 16.

Next, the remaining photoresist film R is used as a mask, thereby etching the under layer 19a and the finishing layer 19b (S43). As a result, as shown in FIG. 17, the pair of excitation electrodes 15 and mount electrodes 16 and 17, in which the under layer 19a and the finishing layer 19b are stacked, are integrally formed.

As mentioned above, the electrode forming process is finished.

Next, as an insulation film forming process, the insulation film 20 is formed on the piezoelectric vibrating reed 4 so as to cover the pair of excitation electrodes 15 (S50).

The insulation film forming process will be explained in detail. Firstly, the finishing layer 19b in the pair of excitation electrodes 15 is removed. Specifically, a photoresist film (not shown) is formed by a spray coat or the like and then is patterned so that the mount electrodes 16 and 17 are coated by the photolithography technique (S51). At this time, when there is a need to expose the respective side surface in order to remove the photoresist film formed on the side surface of the pair of vibration arm portions 10 and 11, for example, a slope light exposure, in which the light exposure is performed from the oblique upper part (or the oblique lower part) with respect to the respective piezoelectric vibrating reeds 4, may be performed to expose the side surface.

Figure 18:
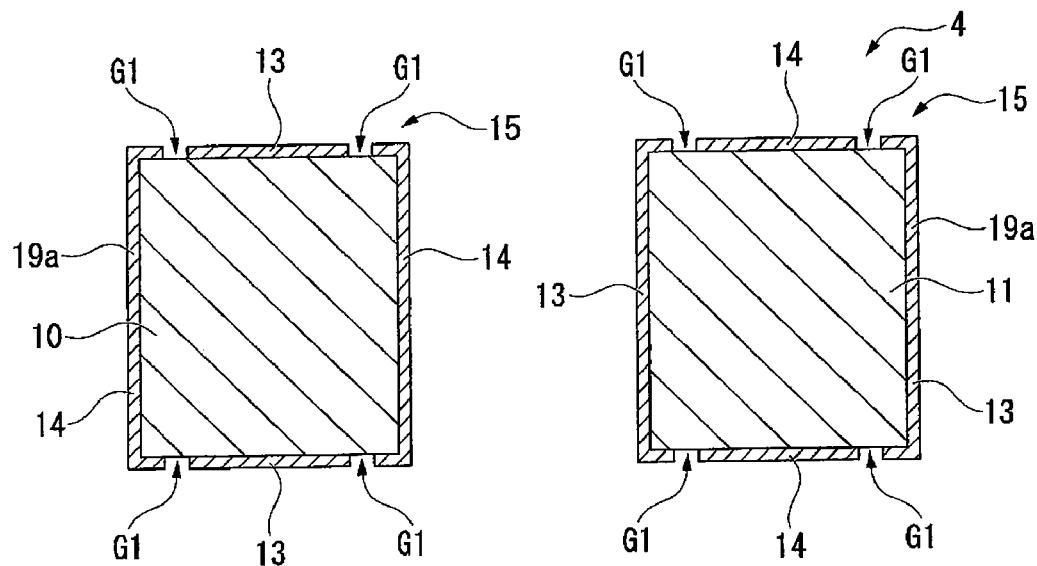
FIG. 18 is a diagram showing a process of manufacturing the piezoelectric vibrator according to the flow chart shown in FIG. 11 which shows a state in which etching has been performed on a finishing layer after the state shown in FIG. 17.

Next, as shown in FIG. 18, the photoresist film is used as a mask, thereby etching the finishing layer 19b (S52). As a result, the finishing layer 19b can be removed from the pair of excitation electrodes 15, in a state in which the finishing layer 19b remains on the mount electrodes 16 and 17.

Figure 19:
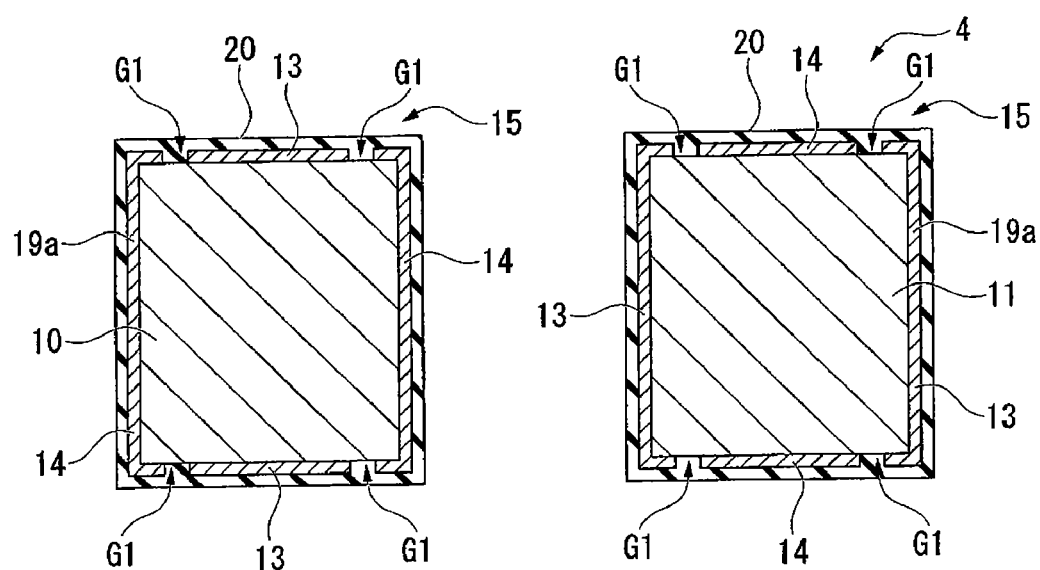
FIG. 19 is a diagram showing a process of manufacturing the piezoelectric vibrator according to the flow chart shown in FIG. 11 which shows a state in which an insulation film is formed after the state shown in FIG. 18.

Next, as shown in FIG. 19, the insulation film 20 is formed on the under layer 19a using silicon dioxide, for example, by a thermal CVD method or the like (S53). At this time, the insulation film 20 is formed over the upper surface side, the lower surface side and both side surface sides of the piezoelectric vibrating reed 4, on the outer surface of the piezoelectric vibrating reed 4 which is situated from the proximal end of the pairs of excitation electrodes 15 to the front ends thereof in the longitudinal direction of the piezoelectric vibrating reed 4.

The insulation film forming process is finished as described above. As a result, the pair of excitation electrodes 15 can be protected by the insulation film 20, whereby the exposure of the pair of excitation electrodes 15 can be prevented to suppress direct contact from the outside.

Particularly, since the finishing layer 19b is removed from the pair of excitation electrodes 15 and the insulation film 20 is formed on the chromium under layer 19a by silicon dioxide having a high cohesion with chromium, it is possible to strongly bring the pair of excitation electrodes 15 and the insulation film 20 into close contact with each other. For that reason, it is possible to suppress the peeling of the insulation film 20.

Next, a weight metal film 21 (e.g., silver, gold or the like) including a rough regulation film 21a and a minute regulation film 21b for frequency regulation is coated on the front ends of the pair of vibration arm portions 10 and 11 (S60). In addition, the timing when the weight metal film 21 is coated may be immediately before the insulation film forming process or simultaneously with the insulation film forming process.

Next, as a rough regulation process, with respect to the respective piezoelectric vibrating reeds 4, the resonance frequency is roughly regulated (S70). At this time, the rough regulation film of the weight metal film 21 is irradiated with a laser beam to lighten the weight applied to the front ends of the pair of vibration arm portions 10 and 11, thereby regulating the frequency. In addition, minute regulation, in which the resonance frequency is further accurately regulated, is performed after the mounting. This process will be explained later.

Next, as a cutting process, a connection portion, by which the wafer S and the piezoelectric vibrating reed 4 are connected to each other, is cut and the piezoelectric vibrating reed 4 is separated from the wafer S and is formed as a small piece (S80). As a result, it is possible to manufacture a plurality of piezoelectric vibrating reeds 4 from one wafer S at a time.

The piezoelectric vibrating reed producing process is finished as described above.

Figure 20:
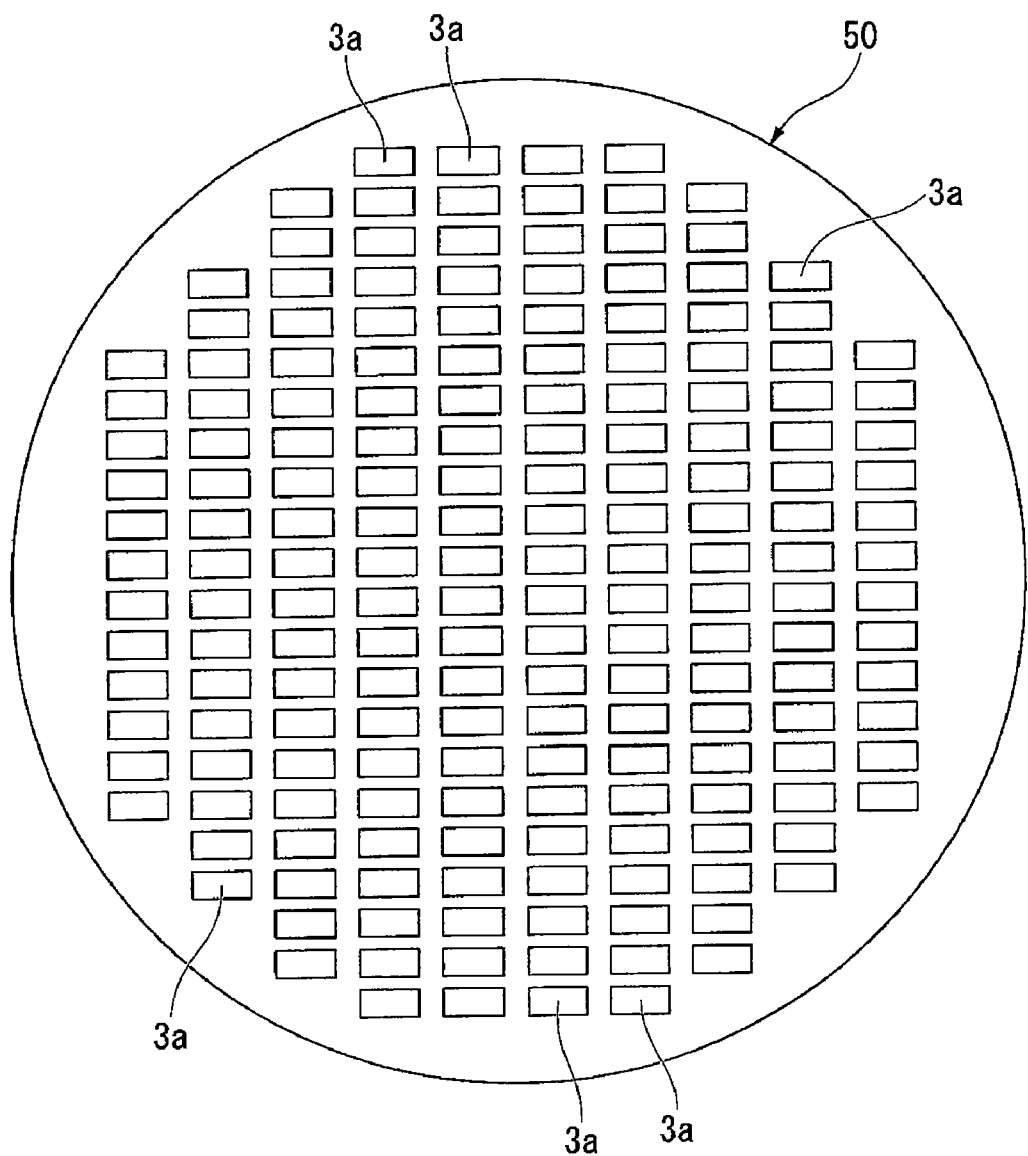
FIG. 20 is a diagram showing a process of manufacturing the piezoelectric vibrator according to the flow chart shown in FIG. 11 which shows a state in which a plurality of grooves is formed on a lid substrate wafer that is the basis of a lid substrate.

Next, at the timing simultaneously with or immediately before and after the piezoelectric vibrating reed producing process, as a first wafer producing process, the lid substrate wafer 50 becoming the lid substrate 3 later is produced until the state immediately before anode bonding is to be performed (S90). Firstly, after the soda lime glass is polished up to a predetermined thickness and is cleaned, a circular plate-shaped lid substrate wafer 50, in which a deformed layer of the topmost surface is removed by etching or the like, is formed (S91). Next, as a concave portion forming process, as shown in FIG. 20, a plurality of concave portions 3a is formed on the bonding surface of the lid substrate wafer 50 in a row and column direction by etching or the like (S92). At this point in time, the first wafer producing process is finished.

Next, at the timing simultaneously with or immediately before and after the first wafer producing process, as a second wafer producing process, the base substrate wafer 40 becoming the base substrate 2 later is produced until the state immediately before anode bonding is to be performed (S100). Firstly, after the soda lime glass is polished up to a predetermined thickness and is cleaned similarly to the lid substrate wafer 50, a circular plate-shaped base substrate wafer 40, in which a deformed layer of the topmost surface is removed by etching or the like, is formed (S101).

Next, as a through electrode forming process, a plurality of pairs of through electrodes 32 and 33 is formed in the base substrate wafer 40 (S102). At this time, for example, after a plurality of pairs of through holes, which penetrates the base substrate wafers 40 in the up and down direction, is formed by sand blasting, press working or the like, the pair of through electrodes 32 and 33 is formed in the plurality of through holes. By the pair of through electrodes 32 and 33, the conductivity of the upper surface side and the lower surface side of the base substrate wafer 40 is secured.

Next, as a getter material forming process, the getter material 34 is formed on the base substrate wafer 40 (S103). At this time, the getter material 34 is formed so as to be arranged within the cavity C which is formed between the base substrate wafer 40 and the lid substrate wafer 50 later. In addition, two getter materials 34 are formed so as to be oppositely arranged at both sides with the piezoelectric vibrating reed 4 interposed therebetween when seen from the plane when the piezoelectric vibrating reed 4 is mounted on the base substrate wafer 40 later, and the respective getter materials 34 are formed so as to extend in parallel to the vibration arm portions 10 and 11 in the position adjacent to the insulation film 20.

Figure 21:
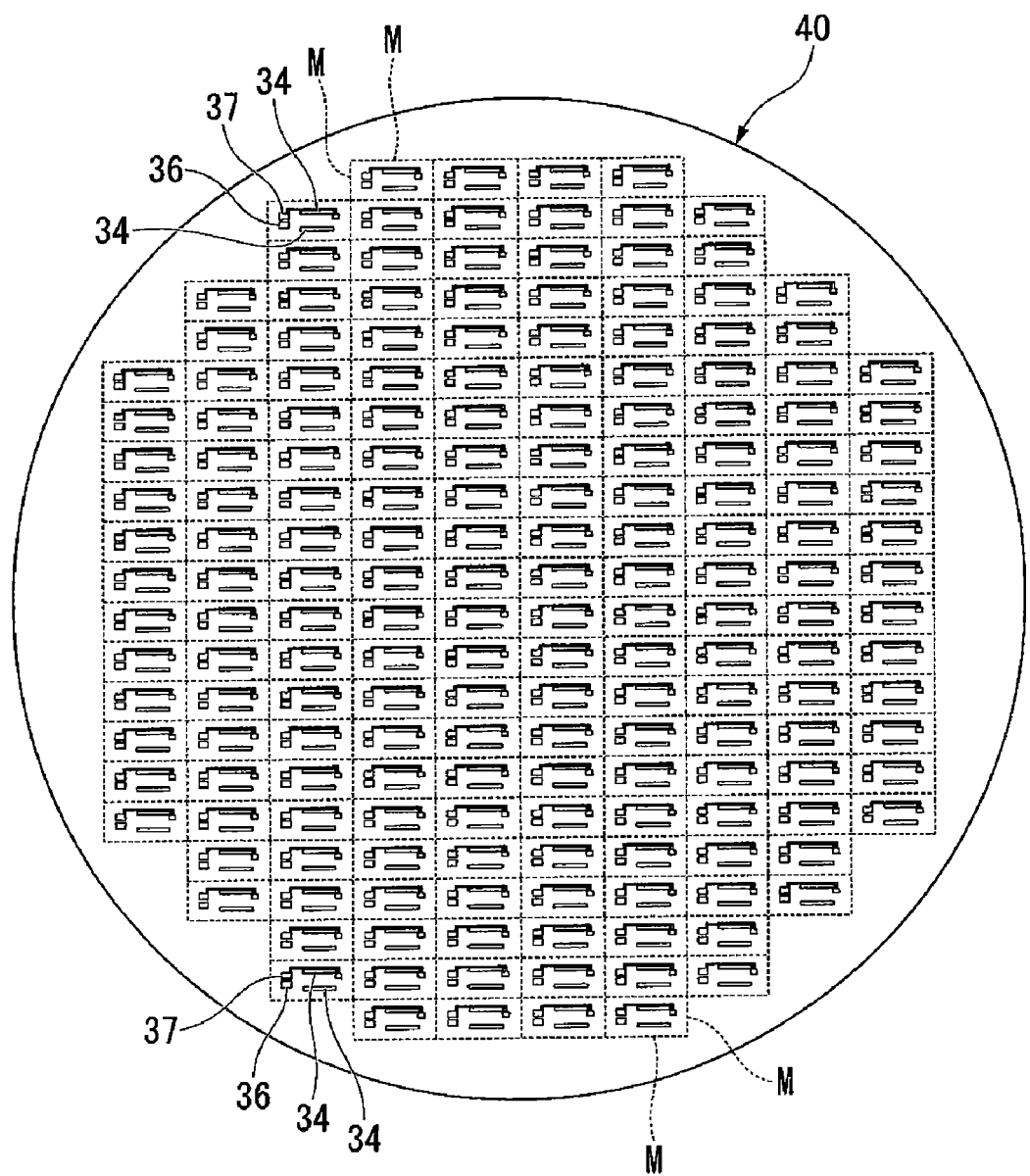
FIG. 21 is a diagram showing a process of manufacturing the piezoelectric vibrator according to the flow chart shown in FIG. 11 which shows a state in which a getter material and a lead-out electrode are patterned on an upper surface of a base substrate wafer that is the basis of a base substrate.

Next, as a bonding film forming process, as shown in FIG. 21, the conductive material is patterned on the upper surface of the base substrate wafer 40 to form the bonding film 35 (S104), and as a lead-out electrode forming process, a plurality of lead-out electrodes 36 and 37, which is electrically connected to the respective pairs of through electrodes 32 and 33, respectively, is formed (S105). In addition, the dash lines M shown in FIG. 21 show cutting lines which are cut in a cutting process performed later. Furthermore, in FIG. 21, in order to make the drawings easier to see, the bonding film 35 is omitted.

At this point in time, the second wafer producing process is finished.

Figure 12:
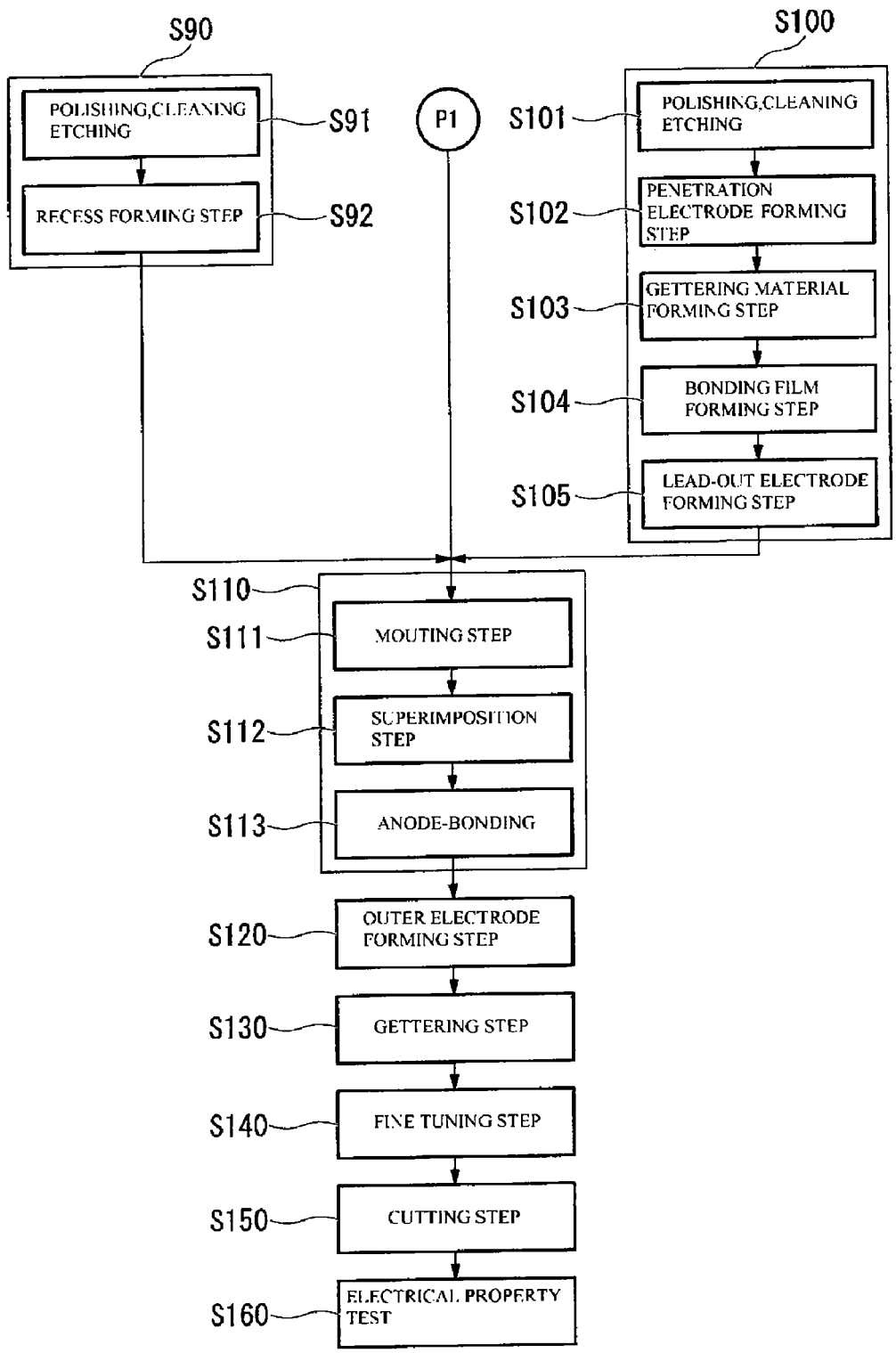
FIG. 12 is a continuation of the flow chart shown in FIG. 11.

Incidentally, FIG. 12 shows a process order in which the getter material forming process (S103), the bonding film forming process (S104), and the lead-out electrode forming process (S105) are sequentially performed, but the process order may be suitably changed without being limited thereto. A part or all of the processes may also be concurrently performed. Even in any process order, the same working effect can be obtained.

Next, as a bonding process, the base substrate wafer 40 and the lid substrate wafer 50 are bonded (S110). The bonding process will be explained in greater detail. Firstly, as the mounting process, the plurality of produced piezoelectric vibrating reeds 4 is bonded to the upper surface of the base substrate wafer 40 via the lead-out electrodes 36 and 37, respectively (S111). At this time, firstly, the bump B made of gold or the like is bonded on the pair of lead-out electrodes 36 and 37, respectively. Moreover, after the base portion 12 of the piezoelectric vibrating reed 4 is mounted on the bump B, the piezoelectric vibrating reed 4 is pressed to the bump B while heating the bump B at a predetermined temperature. As a result, the piezoelectric vibrating reed 4 is mechanically supported on the bump B, and the mount electrodes 16 and 17 and the lead-out electrodes 36 and 37 are electrically connected to each other. Thus, at this point in time, the pair of excitation electrodes 15 of the piezoelectric vibrating reed 4 is conducted to the pair of through electrodes 32 and 33, respectively.

After the mounting of the piezoelectric vibrating reed 4 is finished, as an overlapping process, the lid substrate wafer 50 is overlapped with the base substrate wafer 40 (S112). Specifically, both wafers 40 and 50 are aligned in the correct position while setting a standard mark (not shown) or the like as an index. As a result, the piezoelectric vibrating reed 4, the getter material 34 and the lead-out electrodes 36 and 37 are accommodated within the cavity C which is surrounded by the concave portion 3a formed on the base substrate wafer 40 and both wafers 40 and 50.

Figure 22:
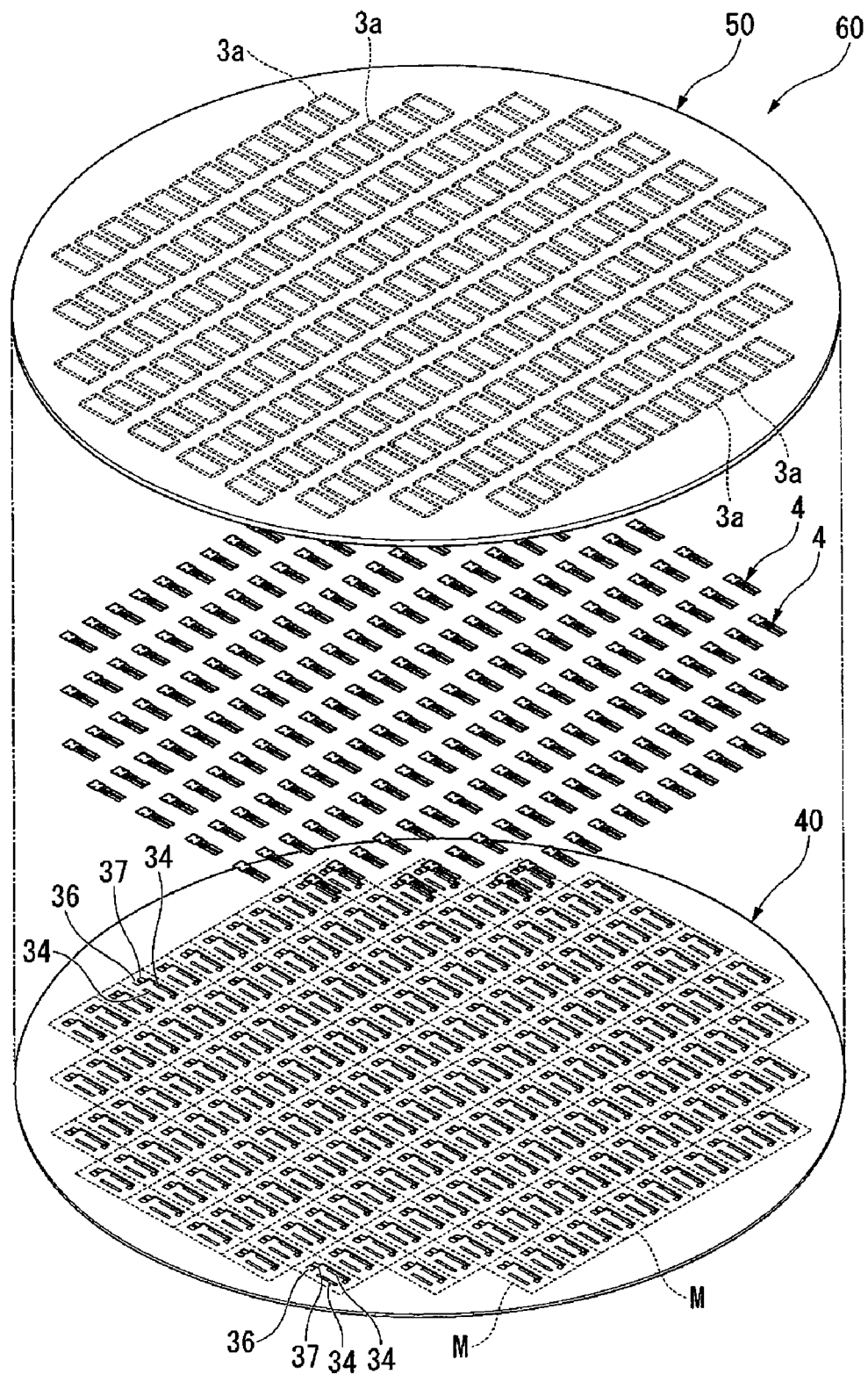
FIG. 22 is a diagram showing a process of manufacturing the piezoelectric vibrator according to the flow chart shown in FIG. 11 which shows an exploded perspective view of a wafer body in which a base substrate wafer and a lid substrate wafer are subjected to an anode bonding in a state in which the piezoelectric vibrating reed is accommodated in the cavity.

After the overlapping process, the two overlapped wafers 40 and 50 are put in an anode bonding device (not shown), and a predetermined voltage is applied at a predetermined temperature environment to perform the anode bonding (S113). Specifically, a predetermined voltage is applied between the bonding film 35 and the lid substrate wafer 50. Then, an electrochemical reaction occurs on an interface between the bonding film 35 and the lid substrate wafer 50, and both are strongly bonded to each other and are subjected to the anode bonding. As a result, it is possible to obtain a wafer body 60 shown in FIG. 22 in which the base substrate wafer 40 and the lid substrate wafer 50 are bonded to each other. In addition, in FIG. 22, in order to make the drawing easier to see, the wafer body 60 is shown in an exploded view, and the bonding film 35 from the base substrate wafer 40 is omitted. In addition, the dash lines M shown in FIG. 22 show the cutting lines which are cut in a cutting process performed later. The bonding process is finished as described above.

Next, as an outer electrode forming process, an inductive material is patterned on the lower surface of the base substrate wafer 40, and a plurality of pairs of outer electrodes 38 and 39, which is electrically connected to the pair of through electrodes 32 and 33, respectively, is formed (S120). By this process, it is possible to operate the piezoelectric vibrating reed 4 accommodated in the cavity C using the outer electrodes 38 and 39.

Next, as a gettering process, the getter material 34 accommodated in the respective cavities C of the wafer body 60 is heated to adjust the degree of vacuum within the cavity C (S130). Specifically, the wafer body 60 is set in a gettering adjuster (not shown), a predetermined voltage is applied to the outer electrodes 38 and 39 within the gettering adjuster to vibrate the piezoelectric vibrating reed 4, and a series vibration resistance, which is in a proportional relationship with the equivalent resistance value, is measured. Based on the series resistance vibration value, for example, the getter material 34 is heated by irradiating a laser from the base substrate wafer 40, thereby performing gettering a suitable number of times.

In addition, as a method of deciding the suitable number of times that gettering should be performed, for example, a method of setting a threshold value of the series vibration resistance value for each type of the piezoelectric vibrator 1 in advance and deciding to be suitable when it is lower than the threshold value may be used. Furthermore, the gettering can be performed after storing the series vibration resistance value immediately before the gettering, and the ratio of change between it and the series vibration resistance value immediately after the gettering calculated, whereby the number of gettering may be decided by comparing the ratio of the change with a prescribed value.

Next, in the state of the wafer body 60, as a minute regulation process, the frequency of the respective piezoelectric vibrating reed 4 accommodated in the cavity C is minutely adjusted to put the same within a predetermined range (S140). To explain specifically, the voltage is applied to the pair of outer electrodes 38 and 39 formed on the lower surface of the base substrate wafer 40 to vibrate the voltage vibrating reed 4. Moreover, a laser beam is irradiated from the outside through the base substrate wafer 40 while measuring the frequency, thereby evaporating the minute regulation film 21b of the weight metal film 21. As a result, the weight of the front end side of the pair of vibration arm portions 10 and 11 is changed, which makes it possible to minutely regulate the frequency of the piezoelectric vibrating reed 4 so as to be limited to a predetermined range of the nominal frequency.

After the minute regulation of the frequency is finished, as a cutting process, the bonded wafer body 60 is cut along the cutting lines M shown in FIG. 22 to form small pieces (S150). As a result, it is possible to manufacture a plurality of surface mount type piezoelectric vibrators 1 having two layer structures shown in FIG. 1, in which the piezoelectric vibrating reed 4 is accommodated in the cavity C formed between the base substrate 2 and the lid substrate 3 joined to each other, at a time.

In addition, after the cutting process (S150) is finished to form the small pieces to the respective piezoelectric vibrators 1, the minute process (S140) may be performed. However, as described above, by performing the minute process (S140)

first, the minute regulation can be performed in the state of the wafer 60, which makes it possible to further effectively and minutely regulate the plurality of piezoelectric vibrators 1. Accordingly, it is desirable in that an improvement in throughput can be promoted.

After that, an internal electrical property inspection is performed (S160). That is, the resonant frequency, the resonant resistance value, and the drive level property (an excitation electric power dependence of the resonant frequency and the resonant resistance value) of the piezoelectric vibrating reed 4 are measured and checked. Furthermore, the insulation resistance property or the like is jointly checked. Moreover, the exterior test of the piezoelectric vibrator 1 is performed at the end, and the size, the quality or the like are finally checked. As a result, the manufacturing of the piezoelectric vibrator 1 is finished.

Particularly, the getter material 34 is formed on the base substrate wafer 40 (the base substrate 2) and not on the piezoelectric vibrating reed 4. Thus, during the gettering process, even if the getter material 34 is heated by a laser, the piezoelectric vibrating reed 4 is not affected by the heating. Accordingly, the piezoelectric vibrating reed 4 is not exposed to the stresses of heating. For this reason, since the quality or the property of the piezoelectric vibrator 1 are not affected, high quality of the piezoelectric vibrator 1 can be promoted.

In addition, as the pair of excitation electrodes 15 is protected by the insulation film 20, during the gettering process, even if the getter material 34 is scattered in the direction of the pair of excitation electrodes 15 by evaporation, the getter material 34 can be attached to the insulation film 20. That is, it is possible to suppress the getter material 34 from being attached to the pair of excitation electrodes 15 not as in the related art. For that reason, it is possible to perform the gettering while suppressing the short-circuiting of the portion between the pair of excitation electrodes 15.

Furthermore, the getter material 34 is formed in the position adjacent to the insulation film 20. For that reason, during the gettering process, the getter material 34 scattered by the evaporation can be actively attached to the insulation film 20, whereby it is possible to suppress the getter material 34 from being attached to other areas (for example, the mount electrodes 16 and 17) of the piezoelectric vibrating reed 4 that are not covered by the insulation film 20. That is, it is possible to limit the area, to which the getter material 34 is attached, to the insulation film 20 protecting the pair of excitation electrodes 15. When it is assumed if the getter material 34 is attached to the portions other than the insulation film 20, (there is a chance that) the piezoelectric vibrating reed 4 may be somewhat affected. However, since the attachment of the getter material 34 can be integrated to the insulation film 20, this concern does not exist. Thus, high quality can be further promoted.

Moreover, since the getter material 34 is formed on the base substrate base 40 (the base substrate 2), during the gettering process, the getter material 34 scattered by evaporation is further actively integrated to the lower surface side of the piezoelectric vibrating reed 4 facing the substrates.

Herein, as the upper surface side and the lower surface side of the piezoelectric vibrating reed 4 are covered by the insulation film 20, during the gettering process, the getter material 34 scattered by the evaporation can reliably be attached to the insulation film 20. As a result, it is possible to further suppress the getter material 34 from being attached to the pair of excitation electrodes 15, whereby the gettering can be performed while further reliably suppressing the short-circuiting of the portion between the pair of excitation electrodes 15.

Furthermore, by forming the insulation film 20 at both of the upper surface and the lower surface, it is possible to suppress the getter material 34 from being attached to the gap G1 of the narrow distance separating the first excitation electrode 13 and the second excitation electrode 14. As a consequence, the short-circuiting of the portion between the pair of excitation electrodes 15 can be further suppressed.

In addition, the insulation film 20 is formed at both of the upper surface side and the lower surface side of the piezoelectric vibrating reed 4 and is formed over both side surfaces. That is, the insulation film 20 is formed on the whole circumference of the piezoelectric vibrating reed 4. As a result, it is possible to further suppress the evaporated getter material 34 from being attached to the pair of excitation electrodes 15.

Moreover, since the insulation film 20 is formed at both of the upper surface side and the lower surface side of the piezoelectric vibrating reed 4, it is possible to suppress the difference between the upper surface and the lower surface of the film stress generated by the insulation film 20 to a small extent. For this reason, the frequency of the piezoelectric vibrating reed 4 during vibration can be stabilized.

Furthermore, since the mount electrodes 16 and 17 and the pair of excitation electrodes 15 are integrally formed, the conductivity between both electrodes can be secured.

Furthermore, since the mount electrodes 16 and 17 use chromium with a high hardness as the under layer 19a, the mount electrodes 16 and 17 can be strengthened. In addition, since gold is used as the finishing layer 19b, the conductivity of the mount electrodes 16 and 17 and the mount property upon mounting can stably be secured. From these, the high quality of the piezoelectric vibrator 1 can be promoted.

Next, an embodiment of the oscillator according to the invention will be explained with reference to FIG. 23.

Figure 23:
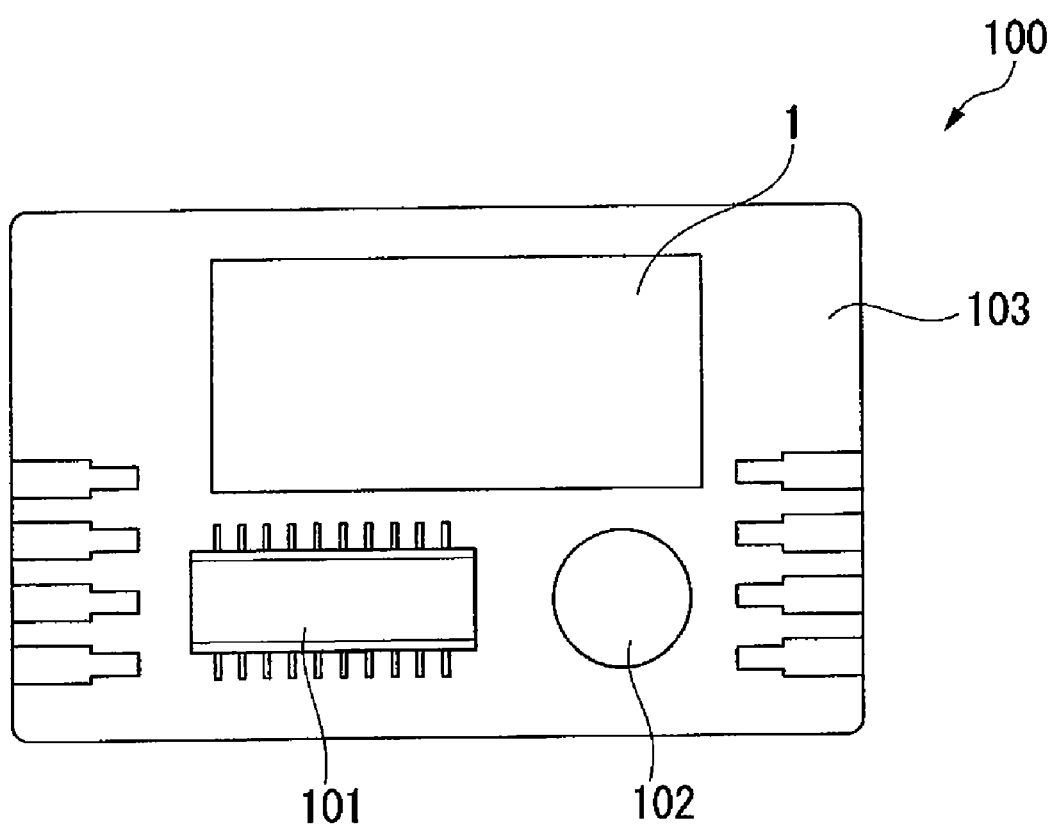
FIG. 23 is a configuration diagram showing an embodiment of an oscillator according to the invention.

As shown in FIG. 23, an oscillator 100 of the present embodiment is constituted as an oscillator in which the piezoelectric vibrator 1 is electrically connected to an integrated circuit 101. The oscillator 100 includes a substrate 103 on which an electronic component 102 such as a condenser is mounted. The integrated circuit 101 for the oscillator is mounted on the substrate 103, and the piezoelectric vibrator 1 is mounted in the vicinity of the integrated circuit 101. The electronic component 102, the integrated circuit 101 and the piezoelectric vibrator 1 are electrically connected to each other by a wiring pattern (not shown), respectively. In addition, the respective constituents are molded by resin (not shown).

In the oscillator 100 configured as above, when the voltage is applied to the piezoelectric vibrator 1, the piezoelectric vibrating reed 4 in the piezoelectric vibrator 1 is vibrated. The vibration is converted to the electric signal by the piezoelectric property of the piezoelectric vibrating reed 4 and input in the integrated circuit 101 as the electric signal. The input electric signal is subjected to the respective processing by the integrated circuit 101 and is output as the frequency signal. As a result, the piezoelectric vibrator 1 functions as the oscillator.

Furthermore, in the configuration of the integrated circuit 101, by selectively setting an RTC (Real Time Clock) module or the like, for example, depending on the demand, the function of controlling the operating date or time of the equipment or external equipment, in addition to the timepiece single function oscillator or the like, or providing the time or the calendar or the like, can be added.

As mentioned above, according to the oscillator 100 of the present embodiment, since it includes the piezoelectric vibrator 1 of a high quality, the oscillator 100 itself can also promote high quality. Additionally, it is possible to obtain the high precision frequency signal that is stable over a long period of time.

Figure 24:
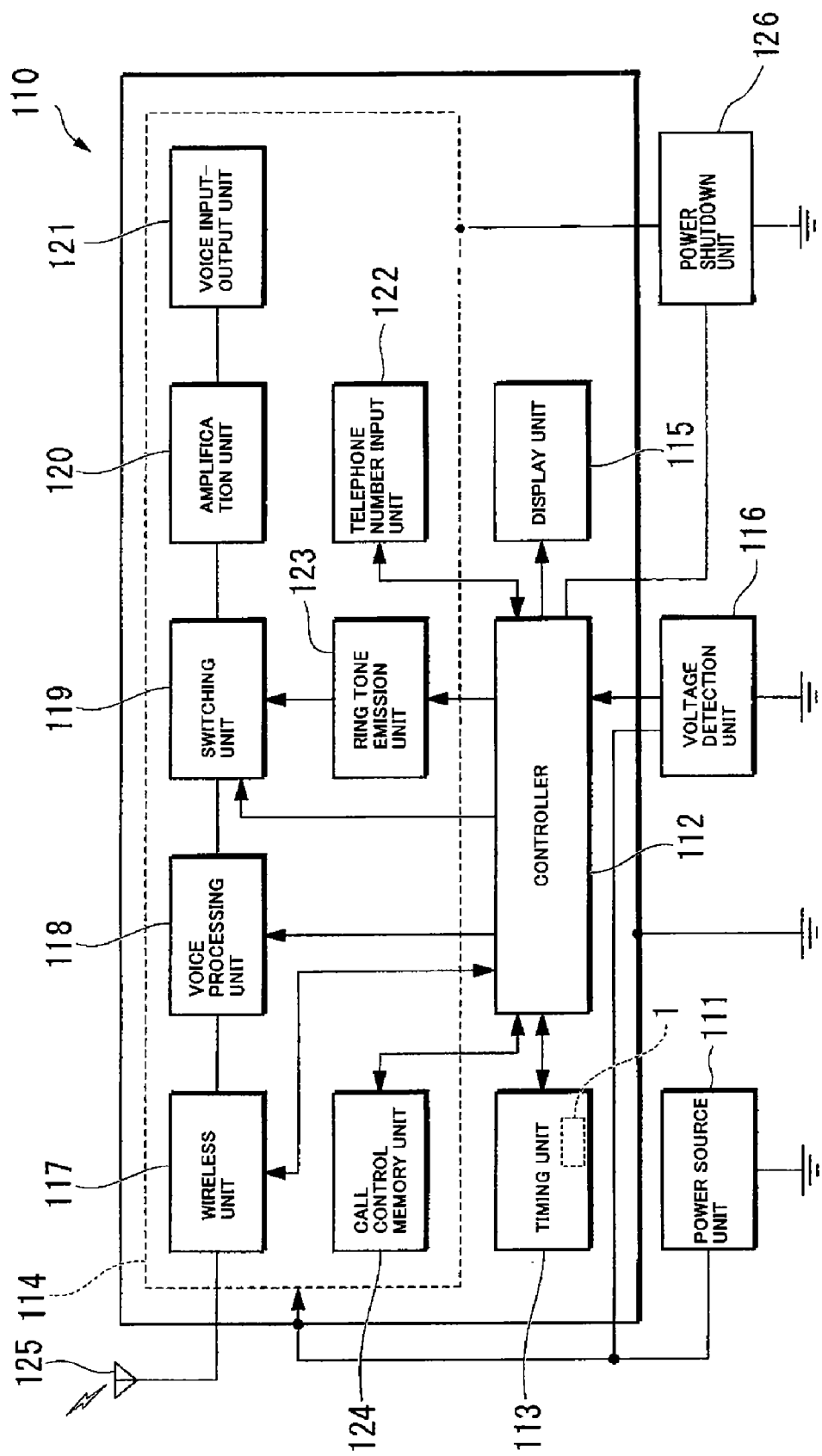
FIG. 24 is a configuration diagram showing an embodiment of electronic equipment according to the invention.

Next, an embodiment of the electronic equipment according to the invention will be explained with reference to FIG. 24. Furthermore, as the electronic equipment, portable information equipment 110 having the above-mentioned piezoelectric vibrator 1 will be explained as an example. Firstly, the portable information equipment 110 of the present embodiment is represented by, for example, a mobile phone, and is one in which a wrist watch in the related art is developed and improved. The exterior thereof is similar to a wrist watch, where a liquid crystal display is arranged on a portion equivalent to the hour plate, and the present time or the like can be displayed on the screen. Furthermore, when it is used as a communicator, it can be separated from the wrist and can perform the same communication as the mobile phone of the related art by a speaker and a microphone built in an inner portion of the band. However, as compared to the mobile phone of the related art, it is radically miniaturized and lightened.

Next, the configuration of the portable information equipment 110 of the present embodiment will be explained. As shown in FIG. 24, the portable information equipment 110 includes the piezoelectric vibrator 1 and a power source portion 111 for supplying the electric power. The power source portion 111 includes, for example, a lithium secondary battery. A control portion 112 which performs various controls, a measurement portion 113 performing the count of the time or the like, a communication portion 114 performing the communication with the outside, a display portion 115 displaying various information, and a voltage detection portion 116 detecting the voltage of the respective functional portions are connected to the power source portion 111 in parallel. Moreover, the respective functional portions are provided with electric power by the power source portion 111.

The control portion 112 controls the respective functional portions to perform the operational control of the whole system such as the transmission and the reception of the sound data, or the measurement or the display of the current time. Furthermore, the control portion 112 includes a ROM with a program written thereon in advance, a CPU that reads and executes the program written on the ROM, and a RAM or the like used as a work area of the CPU.

The measurement portion 113 includes an integrated circuit, which is equipped with an oscillation circuit, a register circuit, a counter circuit, interface circuit or the like, and the piezoelectric vibrator 1. When the voltage is applied to the piezoelectric vibrator 1, the piezoelectric vibrating reed 4 is vibrated, the vibration is converted to the electric signal by the piezoelectric property of crystal, and is input to the oscillation circuit as the electric signal. The output of the oscillation circuit is binarized and is counted by the register circuit and the counter circuit. Moreover, the signal is transmitted to and received from the control portion 112 via the interface circuit, and the current time, the current date, the calendar information or the like is displayed on the display portion 115.

The communication portion 114 has the same function as the mobile phone of the related art, and includes a wireless portion 117, a sound processing portion 118, a switch-over portion 119, an amplification portion 120, a sound input and output portion 121, a phone number input portion 122, a ring tone generation portion 123, and a call control memory portion 124.

The wireless portion 117 performs the exchange of the transmission and the reception of various data such as sound data with a base station via an antenna 125. The sound processing portion 118 encodes and decrypts the sound signal input from the wireless portion 117 or the amplification portion 120. The amplification portion 120 amplifies the signal, which is input from the sound processing portion 118 or the sound input and output portion 121, to a predetermined level. The sound input and output portion 121 includes a speaker, a microphone or the like, amplifies the ring tone or the receipt sound, or collect the sound.

Furthermore, the ring tone generation portion 123 creates the ring tone according to calls from the base station. The switch-over portion 119 switches the amplification portion 120 connected to the sound processing portion 118 to the ring tone generation portion 123 only when receiving, whereby the ring tone created in the ring tone generation portion 123 is output to the sound input and output portion 121 via the amplification portion 120.

In addition, the call control memory portion 124 stores the program relating to call control of the departure and the arrival of the communication. Furthermore, the phone number input portion 122 includes, for example, number keys from 0 to 9 and other keys, and by pushing the number keys or the like, the phone number of the call destination or the like is input.

The voltage detection portion 116 detects the voltage drop and notifies it to the control portion 112 when the voltage added to the respective function portions such as the control portion 112 by the power source portion 111 is lower than a predetermined value. The predetermined voltage value of this time is a value which is preset as a minimum voltage necessary for stably operating the communication portion 114, and, for example, is about 3V. The control portion 112 receiving notification of a voltage drop from the voltage detection portion 116 prohibits the operation of the wireless portion 117, the sound processing portion 118, the switch-over portion 119 and the ring tone generation portion 123. Particularly, stopping the operation of the wireless portion 117 having a high rate of electric power consumption is essential. Furthermore, the intent that the communication portion 114 becomes unusable due to the lack of the battery power is displayed on the display portion 115.

That is, the operation of the communication portion 114 can be prohibited by the voltage detection portion 116 and the control portion 112 and the intent can be displayed on the display portion 115. The display may be a text message, but as a more intuitive display, an X (cross) mark may be made on a phone icon displayed on the upper portion of the display surface of the display portion 115.

In addition, the power source shut-off portion 126 which can selectively shut off the power source of the portion relating to the function of the communication portion 114 is included, whereby the function of the communication portion 114 can further reliably be stopped.

As mentioned above, according to the portable information equipment 110 of the present embodiment, since it includes the piezoelectric vibrator 1 of a high quality, the portable information equipment itself can also promote high quality. Additionally, it is possible to display the high precision timepiece information which is stable for a long period of time.

Next, an embodiment of a radio-controlled timepiece according to the invention will be explained with reference to FIG. 25.

Figure 25:
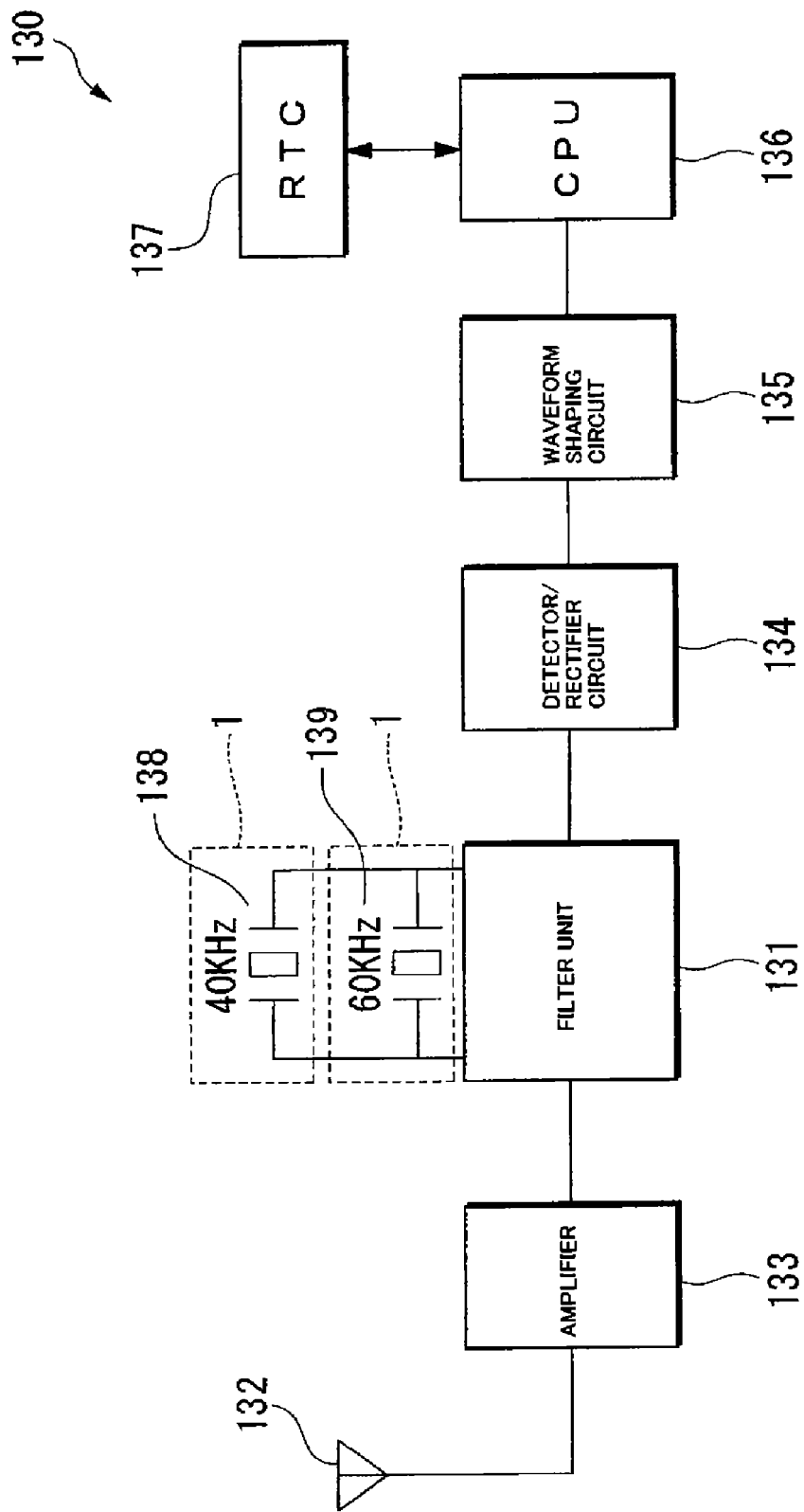
FIG. 25 is a configuration diagram showing an embodiment of a radio-controlled timepiece according to the invention.

As shown in FIG. 25, a radio-controlled timepiece 130 of the present embodiment is a timepiece which includes the piezoelectric vibrator 1 that is electrically connected to a filter portion 131 and includes the function of receiving standard radio waves including the timepiece information and automatically correcting and displaying the same as the correct time.

In Japan, transmitting stations for transmitting standard radio waves exist in Fukushima prefecture (40 KHz) and Saga prefecture (60 KHz), and each transmits the standard radio waves, respectively. Since long waves such as 40 KHz or 60 KHz have a property of spreading across the surface of the earth and a property of spreading while reflecting between the ionization layer and the ground of the earth, the spreading range is wide, and the above-mentioned two transmitting stations cover the whole of Japan.

Hereinafter, a functional configuration of the radio-controlled timepiece 130 will be explained in detail.

An antenna 132 receives the standard radio waves of the long waves at 40 KHz or 60 KHz. The standard radio waves of the long waves apply an AM modulation to the transport waves of 40 KHz or 60 KHz in a time information called a time code. The standard radio waves of the received long waves are amplified by an amp 133 and are filtered and tuned by a filter portion 131 having a plurality of piezoelectric vibrators 1.

The piezoelectric vibrator 1 of the present embodiment includes crystal vibrator portions 138 and 139 having the same resonant frequencies of 40 KHz and 60 KHz as the transport frequency, respectively.

The signal of the filtered predetermined frequency is detected and demodulated by a detection and rectifier circuit 134. Next, the time code is taken out via a wave shaping circuit 135 and is counted by a CPU 136. In the CPU 136, information such as current year, date, day of the week, and time is read. The read information is reflected in an RTC 137 and the correct time information is displayed.

Since the transport waves are 40 KHz or 60 KHz, a vibrator having the above-mentioned tuning fork type structure is suitable for the crystal vibrator portions 138 and 139.

In addition, the aforementioned explanation was shown by an example in Japan, but the frequencies of the standard radio waves of the long waves differ in foreign countries. For example, standard radio waves of 77.5 KHz are used in Germany. Thus, in a case where the radio-controlled timepiece 130 usable in foreign countries is built in a mobile phone, there is a need for the piezoelectric vibrator 1 having a different frequency from the case of Japan.

As mentioned above, according to the radio-controlled timepiece 130 of the present embodiment, since it includes the piezoelectric vibrator 1 of a high quality, the radio-controlled timepiece itself can also promote high quality. Additionally, it is possible to stably and accurately count the time over a long period of time.

In addition, the technical scope of the invention is not limited to the above embodiments but various modifications can be added within a scope without departing from the gist of the invention.

For example, in the above embodiments, the piezoelectric vibrator 1 was the surface mount type piezoelectric vibrator of a two layer structure type in which the base substrate 2 and the lid substrate 3 are directly bonded to each other, but the invention is not limited thereto. The piezoelectric vibrator may be a piezoelectric vibrator of a three layer structure type in which a piezoelectric vibration plate having a frame shape portion surrounding the periphery of the piezoelectric vibrating reed is used, the piezoelectric vibration plate is mounted on the upper surface of the base substrate 2, and then the base substrate 2 and the lid substrate 3 are bonded to each other via the piezoelectric vibration plate, and the piezoelectric vibrating reed is sealed within the cavity C.

In addition, in the above embodiments, two getter materials 34 are formed so as to be oppositely arranged at both sides with the piezoelectric vibrating reed 4 pinched therebetween when seen from the plane, but they may be formed only in the outer one side of the piezoelectric vibrating reed 4. Additionally, the getter materials 34 may not be adjacent to the insulation film 20, and, for example, may be greater than the insulation film 20 in the longitudinal direction of the piezoelectric vibrating reed 4. Furthermore, the getter material 34 may be formed on the lid substrate 3 (the lid substrate wafer 40) but not the base substrate 2 (the base substrate wafer 40).

Furthermore, in the above-mentioned embodiments, the insulation film 20 is formed on the outer surface of the piezoelectric vibrating reed 4 situated from the proximal ends of the pair of excitation electrodes 15 to the front ends thereof in the longitudinal direction of the piezoelectric vibrating reed 4, but only a part of the pair of excitation electrodes 15 must necessarily be covered. Moreover, the insulation film 20 may be formed so as to divide a plurality of places of the outer surface of the piezoelectric vibrating reed 4. Furthermore, the insulation film 20 is formed of silicon dioxide, but it may not necessarily be of silicon dioxide.

Furthermore, in the above-mentioned embodiment, the insulation film 20 was formed on the upper surface side and the lower surface side of the piezoelectric vibrating reed 4, respectively, but it may be formed in only one side thereof and may be formed in none of them. In addition, in the case of forming the insulation film 20 only in any one side thereof, it is desirable to form the insulation film 20 in the surface side facing the substrate on which the getter material 34 is arranged.

Furthermore, the insulation film 20 is formed over both side surface sides of the piezoelectric vibrating reed 4, but it may be formed only in any one side thereof or may be formed in neither of them. In addition, in the case of forming the insulation film 20 in only one side, it is desirably formed in the side surface side near the getter material 34.

Furthermore, in the above-mentioned embodiment, during the electrode forming process, the mount electrodes 16 and 17 and the pair of excitation electrodes 15 were formed by stacking the chromium under layer 19a formed and the gold finishing layer 19b formed, but the materials of the respective layers 19a and 19b are not limited thereto. In addition, the mount electrodes 16 and 17 and the pair of excitation electrodes 15 may be formed by a single layer without stacking the metallic film.

Furthermore, in the above-mentioned embodiment, the mount electrodes 16 and 17 and the pair of excitation electrodes 15 are integrally formed, they may alternatively be separately formed.

Moreover, in the above-mentioned embodiments, during the insulation film forming process, the finishing layer 19b is removed from the pair of excitation electrodes 15, but the finishing layer 19b may be partially removed or may not be removed at all. For example, only the finishing layers 19b of the upper and lower surface sides may be removed. In this case, when forming a photoresist film for removing the finishing layer 19b in the pair of excitation electrodes 15 on the outer surface of the piezoelectric vibrating reed 4, there is no need to remove the photoresist film formed at the side surface side of the piezoelectric vibrating reed 4. Thus, the slope light exposure may not be performed with respect to the piezoelectric vibrating reed 4, whereby the piezoelectric vibrating reed 4 can be more efficiently produced.

Furthermore, in the above-mentioned embodiments, the mount electrodes 16 and 17 are not coated by the insulation film 20, but since the gap G2 between one mount electrode 16 and the other mount electrode 17 is greater than the gap G1 between the first excitation electrode 13 and the second excitation electrode 14, the risk that the short-circuiting occurs in the portion between the mount electrodes 16 and 17 short is extremely low.

Furthermore, if the mount electrodes 16 and 17 are exposed in one surface mounted with the base substrate 2 of both of the upper surface and the lower surface in the piezoelectric vibrating reed 4, the other surface thereof may be coated by the insulation film 20.

Furthermore, in the above-mentioned embodiments, as an example of the piezoelectric vibrating reed 4, the piezoelectric vibrating reed 4 with grooves in which the groove portions 18 are formed on both surfaces of the vibration arm portions 10 and 11 is described, but it may be a type of piezoelectric vibrating reed without the groove portions 18. However, by forming the grove portions 18, when a predetermined voltage is applied to the pair of excitation electrodes 15, the electric field efficiency between the pair of excitation electrodes 15 can be improved, which can further suppress the vibration loss and further improve the vibration property. That is, the CI value (Crystal Impedance) can be further reduced and the high performance of the piezoelectric vibrating reed 4 can be further promoted. Given this point, it is desirable to form the groove portions 18.

Furthermore, while in the above-mentioned embodiments the base substrate 2 and the lid substrate 3 are anode-bonded via the bonding film 35, the invention is not limited to anode-bonding. However, anode-bonding is desirable in that both substrates 2 and 3 can be strongly bonded.

Moreover, while in the above-mentioned embodiment the piezoelectric vibrating reed 4 was bump-bonded, the invention is not limited to bump-bonding. For example, the piezoelectric vibrating reed 4 may be bonded by a conductive adhesive. However, the piezoelectric vibrating reed 4 can float from the upper surface of the base substrate 2 by bump-bonding, whereby it is possible to naturally secure the minimum vibration gap that is necessary for the vibration. Thus, bump-bonding is desirable.

In addition, the constituents in the above-mentioned embodiments can suitably be replaced with well-known constituents without departing from the gist of the invention, and the modification example may suitably be combined with each other.

What is claimed is:

1. A method of manufacturing a piezoelectric vibrator with a piezoelectric vibrating reed accommodated therein which has a pair of vibration arm portions extending in parallel, a pair of excitation electrodes that vibrates the pair of vibration arm portions, and a mount electrode that is electrically connected to the pair of excitation electrodes, within a cavity formed between a base substrate and a lid substrate that are bonded to each other, comprising:
    an insulation film forming process of forming an insulation film so as to cover the excitation electrodes after producing the piezoelectric vibrating reed;
    a getter material forming process of forming a getter material formed of a metallic material, which improves a degree of vacuum in the cavity by being heated, in any one substrate of the base substrate or the lid substrate so as to be arranged within the cavity; and
    a bonding process of bonding the base substrate and the lid substrate to each other so as to accommodate the piezoelectric vibrating reed and the getter material within the cavity after mounting the piezoelectric vibrating reed on the base substrate via the mount electrode.

2. The method of manufacturing the piezoelectric vibrator according to claim 1,
    wherein, during the getter material forming process, two getter materials are formed so as to be oppositely arranged at both sides with the piezoelectric vibrating reed pinched therebetween when the piezoelectric vibrating reed is mounted, and each of the getter materials are formed so as to be extended in parallel to the vibration arm portions at a position adjacent to the insulation film.

3. The method of manufacturing the piezoelectric vibrator according to claim 1,
    wherein, during the insulation film forming process, the insulation film is formed on an upper surface side and a lower surface side of the piezoelectric vibrating reed, respectively, which face the lid substrate and the base substrate, respectively.

4. The method of manufacturing the piezoelectric vibrator according to claim 3,
    wherein, during the insulation film forming process, the insulation film is formed over a side surface side of the piezoelectric vibrating reed.

5. The method of manufacturing the piezoelectric vibrator according to claim 1,
    wherein, upon producing the piezoelectric vibrating reed, the mount electrode and the excitation electrode are formed integrally with an under layer of chromium and a finishing layer of gold, and
    wherein, during the insulation film forming process, after removing the finishing layer in the excitation electrode, the insulation film is formed on the under layer using silicon dioxide.

6. A piezoelectric vibrator comprising:
    a base substrate and a lid substrate which are bonded to each other with a cavity formed therebetween;
    a piezoelectric vibrating reed which has a pair of vibration arm portions extending in parallel, a pair of excitation electrodes that vibrate the pair of vibration arm portions, and a mount electrode that is electrically connected to the pair of excitation electrodes, the piezoelectric vibrating reed being mounted on the base substrate within the cavity via the mount electrode;
    an insulation film which is formed on the piezoelectric vibrating reed so as to cover the excitation electrodes; and
    a getter material formed of the metallic material that is formed on the base substrate or the lid substrate so as to be arranged within the cavity and improve a degree of vacuum within the cavity by being heated.

7. The piezoelectric vibrator according to claim 6,
    wherein two getter materials are formed so as to be oppositely arranged at both sides with the mounted piezoelectric vibrating reed pinched therebetween, and
    wherein each of the getter materials is formed so as to be extended in parallel to the vibration arm portion in a position adjacent to the insulation film.

8. The piezoelectric vibrator according to claim 6,
    wherein the insulation film is formed at an upper surface side and a lower surface side of the piezoelectric vibrating reed, respectively, which face the lid substrate and the base substrate, respectively.

9. The piezoelectric vibrator according to claim 8,
    wherein the insulation film is formed over a side surface side of the piezoelectric vibrating reed.

10. The piezoelectric vibrator according to claim 6,
    wherein the excitation electrodes are formed of chromium, and
    wherein the insulation film is formed of silicon dioxide.

11. An oscillator including the piezoelectric vibrator according to claim 6 which is electrically connected to an integrated circuit as an oscillation element.

12. An electronic equipment including the piezoelectric vibrator according to claim 6 which is electrically connected to a measurement portion.

13. A radio-controlled timepiece having the piezoelectric vibrator described in claim 6 which is electrically connected to a filter portion.

* * * * *